United States Patent
Katsuyama et al.

(10) Patent No.: US 10,277,010 B2
(45) Date of Patent: Apr. 30, 2019

(54) SEMICONDUCTOR LASER

(71) Applicant: SUMITOMO ELECTRIC INDUSTRIES, LTD., Osaka (JP)

(72) Inventors: Tsukuru Katsuyama, Yokohama (JP); Takashi Kato, Chigasaki (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/881,954

(22) Filed: Jan. 29, 2018

(65) Prior Publication Data
US 2018/0261981 A1 Sep. 13, 2018

(30) Foreign Application Priority Data

Mar. 10, 2017 (JP) .................. 2017-046616

(51) Int. Cl.
*H01S 5/22* (2006.01)
*H01S 5/34* (2006.01)
*H01S 5/042* (2006.01)
*H01S 5/343* (2006.01)
*H01S 5/32* (2006.01)
*H01S 5/227* (2006.01)

(52) U.S. Cl.
CPC .......... *H01S 5/3402* (2013.01); *H01S 5/0424* (2013.01); *H01S 5/0425* (2013.01);
(Continued)

(58) Field of Classification Search
CPC .. H01S 5/0206; H01S 5/34346; H01S 5/3408; H01S 5/3401; H01S 5/3407; H01S 5/3402; H01S 5/343; H01S 5/227
(Continued)

(56) References Cited

U.S. PATENT DOCUMENTS

| 5,739,543 A | 4/1998 | Shimizu et al. |
| 6,201,258 B1 * | 3/2001 | Seabaugh ............ H01L 29/155 257/14 |

(Continued)

FOREIGN PATENT DOCUMENTS

| EP | 1708318 | 10/2006 |
| JP | 08-279647 | 10/1996 |

OTHER PUBLICATIONS

U.S. Appl. No. 15/737,139, filed Dec. 15, 2017, Katsuyama, et al.
(Continued)

*Primary Examiner* — Tuan N Nguyen
(74) *Attorney, Agent, or Firm* — Smith, Gambrell & Russell, LLP.

(57) ABSTRACT

A semiconductor laser includes a mesa structure disposed on a principal surface of a substrate, the mesa structure extending in a direction of an axis parallel to the principal surface, the mesa structure including an active region that includes a quantum well, the active region having top and bottom surfaces, and first, second, third and fourth side surfaces; an emitter region disposed on at least one of the first and second side surfaces, and the top and bottom surfaces; and a collector region including a quantum filter structure disposed on at least one of the side surfaces. The collector region is separated from the emitter region on the mesa structure. The first and second side surfaces extend in the direction of the axis. The third side surface extends in a direction intersecting the axis.

8 Claims, 15 Drawing Sheets

(52) U.S. Cl.
CPC ............... *H01S 5/22* (2013.01); *H01S 5/343* (2013.01); *H01S 5/3407* (2013.01); *H01S 5/3408* (2013.01); *H01S 5/34346* (2013.01); *H01S 5/0421* (2013.01); *H01S 5/227* (2013.01); *H01S 5/2228* (2013.01); *H01S 5/3213* (2013.01)

(58) Field of Classification Search
USPC ........................................ 372/38.05, 45.01
See application file for complete search history.

(56) References Cited

U.S. PATENT DOCUMENTS

| | | | |
|---|---|---|---|
| 2005/0018730 A1* | 1/2005 | Taylor | B82Y 20/00 372/50.1 |
| 2005/0067615 A1* | 3/2005 | Yoshii | B82Y 10/00 257/15 |
| 2006/0065886 A1 | 3/2006 | Shi et al. | |
| 2013/0177036 A1 | 7/2013 | Su et al. | |
| 2013/0182736 A1 | 7/2013 | Hashimoto et al. | |
| 2014/0050241 A1 | 2/2014 | Dallesasse et al. | |
| 2014/0273323 A1 | 9/2014 | Kim | |
| 2015/0214425 A1* | 7/2015 | Taylor | H01S 5/0421 385/14 |

OTHER PUBLICATIONS

U.S. Appl. No. 15/881,941, filed Jan. 29, 2018, Katsuyama.
U.S. Appl. No. 15/881,977, filed Jan. 29, 2018, Katsuyama.
Office Action dated Oct. 25, 2018 in U.S. Appl. No. 15/737,139.
Office Action dated Feb. 4, 2019 in U.S. Appl. No. 15/737,139.

* cited by examiner

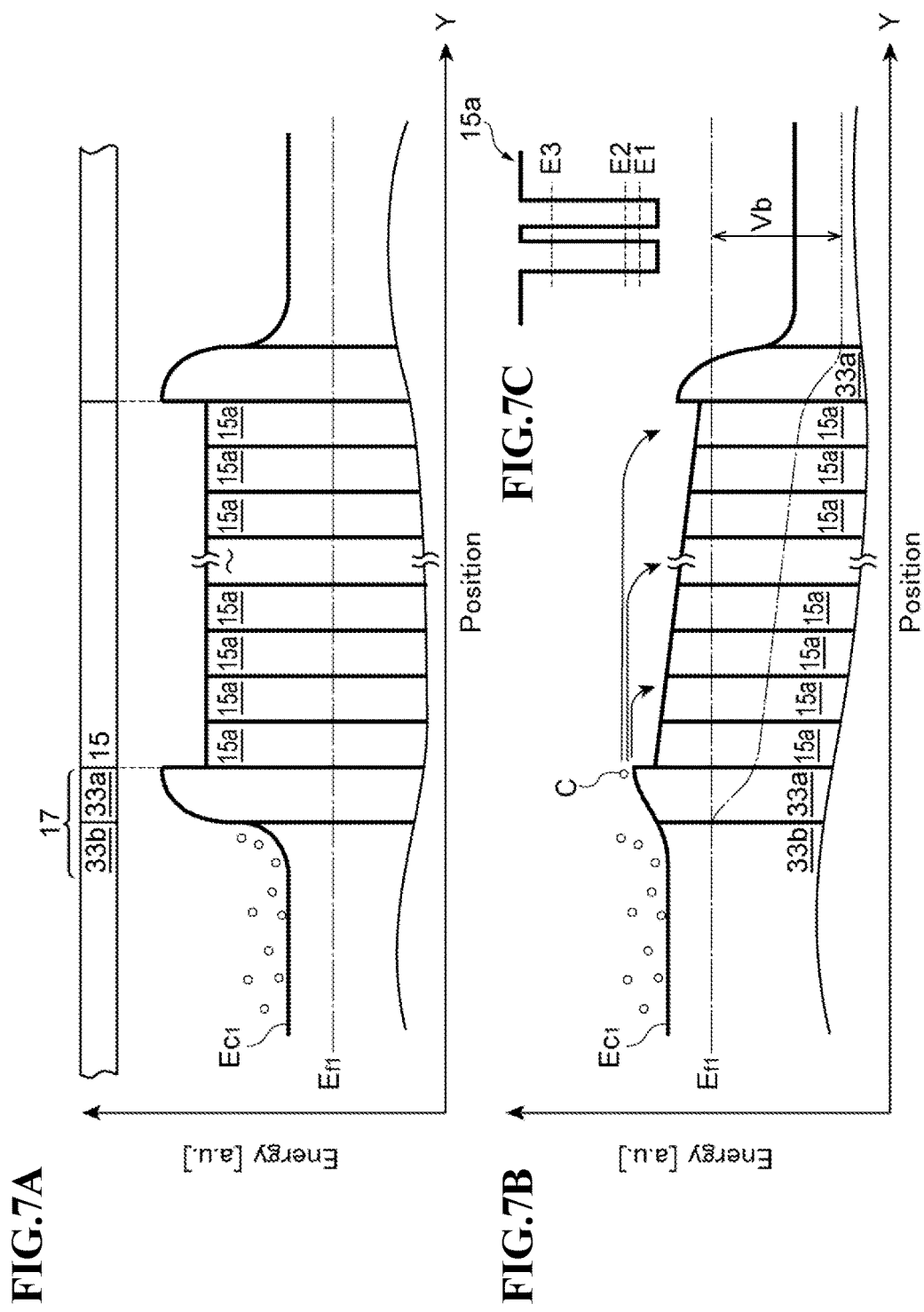

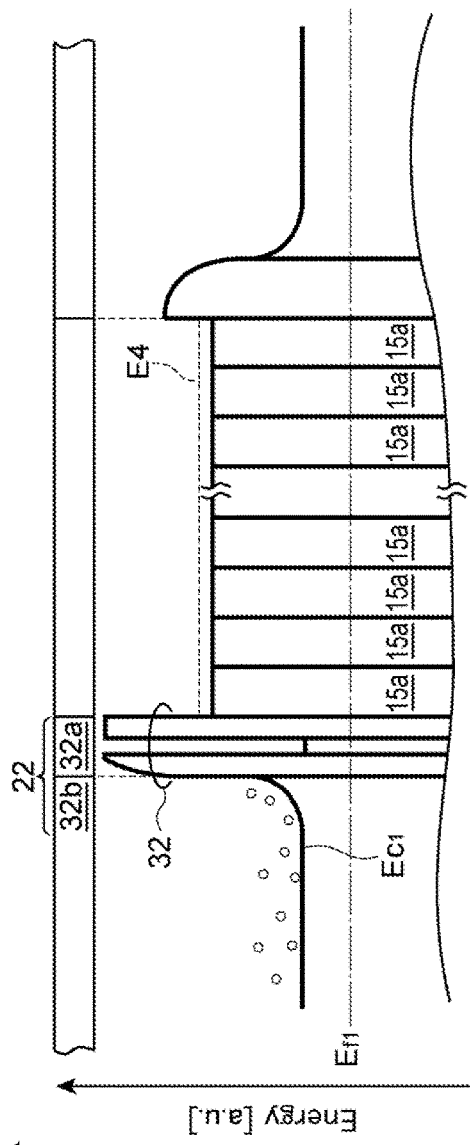
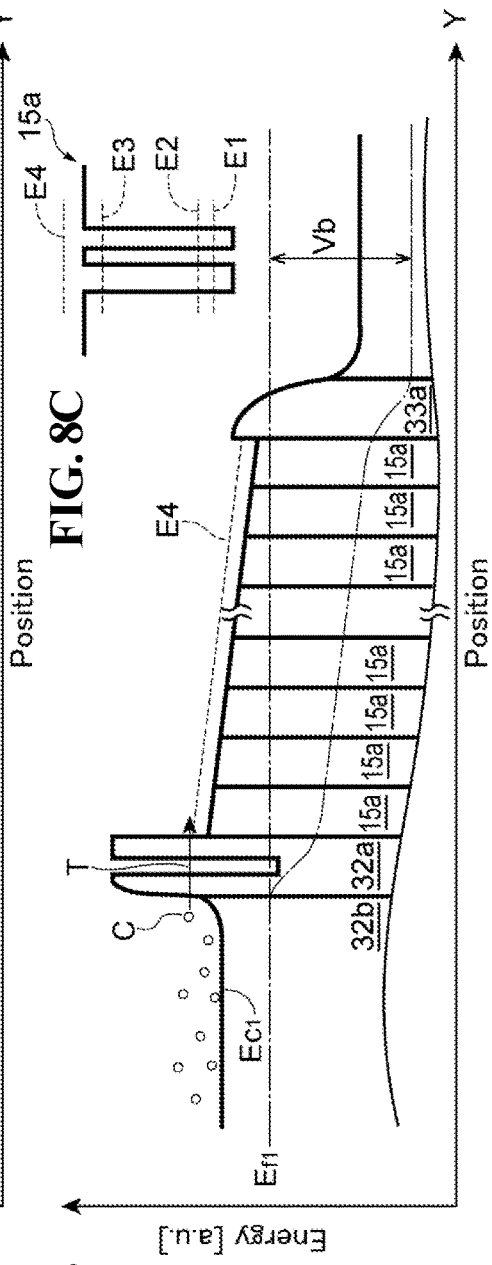
FIG. 8A
FIG. 8B
FIG. 8C

SEMICONDUCTOR LASER

BACKGROUND OF THE INVENTION

1. Field of the Invention

The present invention relates to a semiconductor laser. More particularly, the present invention relates to a semiconductor laser that has a radiation mechanism using unipolar carriers.

2. Description of the Related Art

Japanese Unexamined Patent Application Publication No. 8-279647 discloses a quantum cascade laser.

SUMMARY OF THE INVENTION

A quantum cascade laser (QCL) emits light by using intersubband transitions of unipolar carries in active layers arranged in series, which is sometimes called as the cascaded radiative transition. In order to enhance an efficiency of the cascaded radiative transition, energy levels in one active layer are necessary to be aligned with energy levels in active layers next to the one active layer. Specifically, a higher energy level in the one active layer is aligned with a lower energy level in the upstream active layer, and a lower energy level in the one active layer is aligned with a higher energy level in the downstream active layer. Such a cascaded radiative transition may enhance the optical gain in infrared wavelengths, and resultantly, the cascaded radiative transition realizes the laser oscillation in infrared regions. However, the cascaded radiative transition is inevitable to be supplied with a large bias, which resultantly prohibits a cascade structure of the active layers from operating in reduced biases.

A semiconductor laser according to one aspect of the present invention includes a substrate having a principal surface; a mesa structure disposed on the principal surface of the substrate, the mesa structure extending in a direction of a waveguide axis, the mesa structure including an active region that includes a plurality of quantum well structures arranged in a direction of a first axis intersecting the waveguide axis, the active region having a top surface, a bottom surface, a first side surface, a second side surface, and a third side surface; an emitter region including a first-conductivity-type semiconductor on at least one of the first side surface, the second side surface, the top surface, and the bottom surface of the active region; and a collector region including a quantum filter structure on at least one of the first side surface, the second side surface, and the third side surface of the active region. The collector region is separated from the emitter region on the mesa structure. The first side surface and the second side surface extend in the direction of the waveguide axis. In addition, the third side surface extends in a direction intersecting the waveguide axis.

Objects, features, and advantages of the invention will become more apparent from the following detailed description of preferred embodiments of the invention with reference to the accompanying drawings.

BRIEF DESCRIPTION OF THE DRAWINGS

FIGS. 7A, 7B, and 7C schematically show the supply of carriers from the emitter region into a top surface of the active region of the semiconductor laser according to this embodiment.

FIGS. 8A, 8B, and 8C schematically show the supply of carriers from the emitter region into the top surface of the active region of the semiconductor laser according to this embodiment.

DESCRIPTION OF THE PREFERRED EMBODIMENTS

Figure 1:
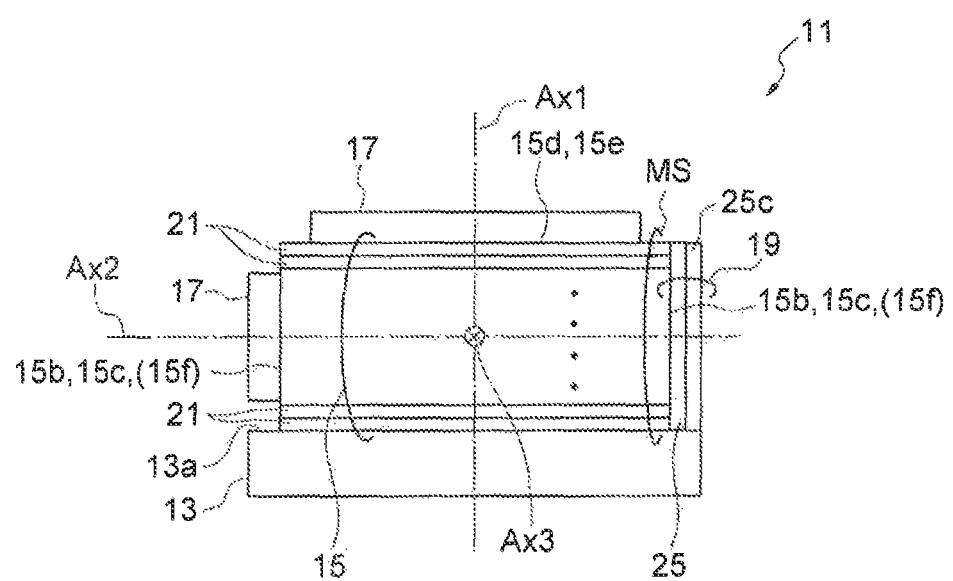
FIG. 1 schematically shows a semiconductor laser according to one embodiment.

Continuing from the above description, some specific embodiments will now be described.

A semiconductor laser according to an embodiment includes (a) a substrate having a principal surface; (b) a mesa structure disposed on the principal surface of the substrate, the mesa structure extending in a direction of a waveguide axis, the mesa structure including an active region that includes a plurality of quantum well structures arranged in a direction of a first axis intersecting the waveguide axis, the active region having a top surface, a bottom surface, a first side surface, a second side surface, and a third side surface; (c) an emitter region including a first-conductivity-type semiconductor on at least one of the first side surface, the second side surface, the top surface, and the bottom surface of the active region; and (d) a collector region including a quantum filter structure on at least one of the first side surface, the second side surface, and the third side surface of the active region. The collector region is separated from the emitter region on the mesa structure. The first side surface and the second side surface extend in the direction of the waveguide axis. In addition, the third side surface extends in a direction intersecting the waveguide axis.

In the semiconductor laser according to an embodiment, preferably, the quantum well structures have an energy band structure with a subband structure that provides a higher energy level and a lower energy level having an energy level lower than that of the upper energy level. The quantum filter structure includes a superlattice structure that passes carriers at the lower energy level with a higher transmission probability than that of carriers at the higher energy level. In addition, each of the quantum well structures may further provide a relaxation energy level having an energy level lower than that of the lower energy level.

In this semiconductor laser, the emitter region supplies carriers to the active region from at least one of the top surface, the bottom surface, the first side surface, and the second side surface of the active region. The carriers injected from the emitter region contribute to light emission through optical transitions from upper to lower energy levels in the subband structure of the quantum well structures. The carriers at the lower energy level flow into the collector region. This semiconductor laser utilizes optical transitions of unipolar carriers for light emission. In addition, the arrangement of the emitter region, the active region, and the collector region does not require cascaded radiative transitions of unipolar carriers for light emission. The quantum filter structure of the collector region extends in the direction of the first axis along at least one of the first side surface, the second side surface, and the third side surface of the active region. The quantum filter structure is in contact with that side surface of the active region and is connected in parallel to the quantum well structures. The parallel connections to the quantum well structures allow cascaded radiative transitions to be avoided. The carriers in the individual quantum well structures drift toward the collector region in the direction of the waveguide axis intersecting the direction of the first axis. The quantum filter structure of the collector region may selectively transmit the carriers at the lower energy level. The quantum filter structure of the collector region includes a superlattice structure having filter characteristics that allow carriers at the lower energy level of the quantum well structures to have a higher transmission probability than that of carriers at the higher energy level of the quantum well structures.

In the semiconductor laser according to an embodiment, preferably, each of the quantum well structures includes a first well layer, a second well layer, a first barrier layer, and a second barrier layer. The first barrier layer separates the first well layer from the second well layer. In addition, the first well layer separates the first barrier layer from the second barrier layer.

In this semiconductor laser, the quantum well structures readily provide the upper energy level and the lower energy level for unipolar carriers. The quantum well structures may also provide the relaxation energy level having an energy level lower than that of the lower energy level. The relaxation of unipolar carriers from the lower energy level to the relaxation energy level occurs in a time shorter than the time for transition from the upper energy level to the lower energy level. The carriers that have transitioned from the upper energy level to the lower energy level relax at high speed to the relaxation energy level. The carriers having an amount of energy equivalent to the relaxation energy level may pass through the quantum filter structure of the collector region.

In the semiconductor laser according to an embodiment, preferably, the active region includes a plurality of unit cells arranged in the direction of the first axis. Each of the unit cells includes the first well layer, the second well layer, the first barrier layer, and the second barrier layer. In addition, the first barrier layer has a thickness smaller than that of the second barrier layer.

In this semiconductor laser, the first barrier layer has a thickness smaller than that of the second barrier layer. Therefore, the first well layer and the second well layer in each unit cell are coupled with each other more closely than with another well layer separated by the second barrier layer in the unit cell.

In the semiconductor laser according to an embodiment, preferably, each of the quantum well structures includes a barrier layer extending in a plane intersecting the direction of the first axis. The barrier layer is partially or completely doped with a dopant of the first-conductivity-type.

In this semiconductor laser, the doped barrier layer is useful for injection into the well layers.

In the semiconductor laser according to an embodiment, preferably, the quantum filter structure includes a first III-V compound semiconductor layer containing three or more elements including aluminum as a group III constituent element and a second III-V compound semiconductor layer containing three or more elements including gallium as a group III constituent element.

In this semiconductor laser, the quantum filter structure includes a combination of a first III-V compound semiconductor layer and a second III-V compound semiconductor layer.

The semiconductor laser according to an embodiment may further include a first electrode disposed on the emitter region and a second electrode disposed on the collector region. The collector region may include a first-conductivity-type semiconductor. The first electrode may be electrically connected to the first-conductivity-type semiconductor of the emitter region. In addition, the second electrode may be electrically connected to the first-conductivity-type semiconductor of the collector region.

The findings of the present invention can be readily understood from the following detailed description with reference to the accompanying drawings, which are given by way of example. A semiconductor laser according to one embodiment of the present invention will now be described with reference to the accompanying drawings, where, if possible, like reference numerals denote like elements.

Figure 2:
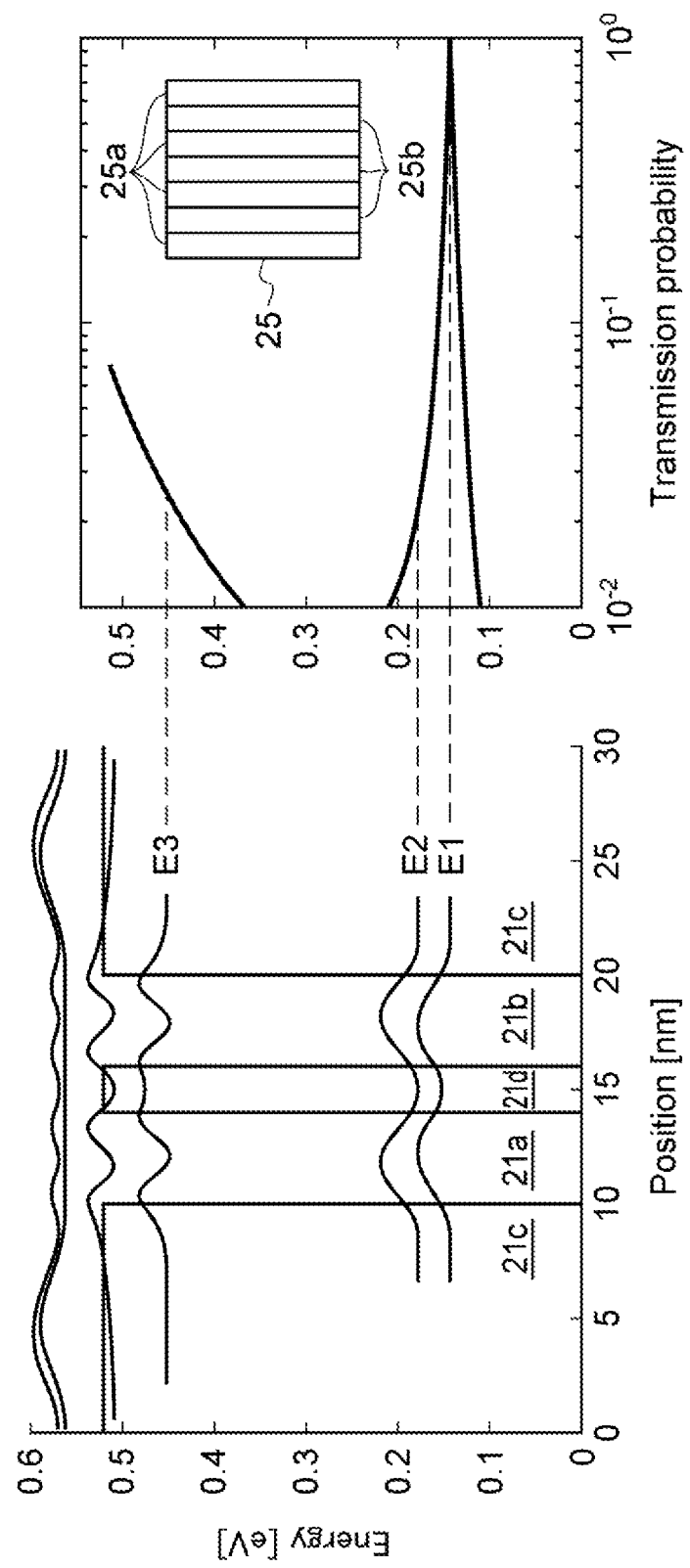
FIG. 2 shows a quantum filter of the semiconductor laser according to this embodiment.
Figure 3:
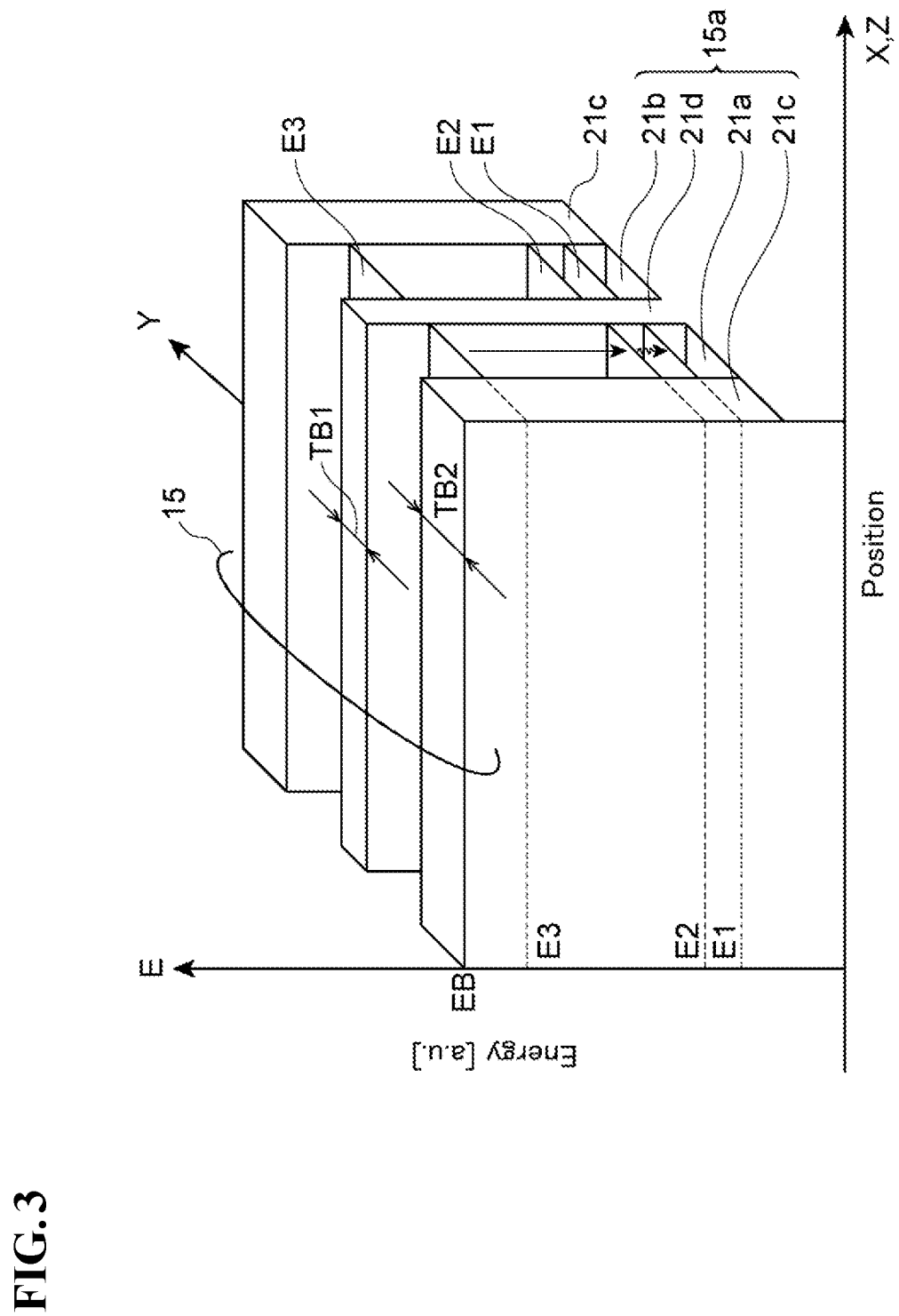
FIG. 3 shows the structure of an active region of the semiconductor laser according to this embodiment.

FIG. 1 schematically shows a semiconductor laser according to this embodiment. FIG. 2 shows a quantum filter of the semiconductor laser according to this embodiment. FIG. 3 shows the structure of the active region of the semiconductor laser according to this embodiment. This semiconductor laser has, for example, a Fabry-Perot (FP) type laser structure or a distributed feedback (DFB) type laser structure.

A semiconductor laser 11 includes a substrate 13, an active region 15, an emitter region 17, and a collector region 19. The active region 15 includes a plurality of quantum well structures 21. Each quantum well structure 21 includes a unit cell 15$a$ having a subband structure that provides a higher energy level and a lower energy level. The active region 15 has the quantum well structures 21 arranged in the direction of a first axis Ax1 intersecting a principal surface 13$a$ of the substrate 13. The active region 15 has a first side surface 15$b$, a second side surface 15$c$, a top surface 15$d$, a bottom surface 15$e$, and a third side surface 15$f$. The active region 15 is disposed in a mesa structure MS extending in the direction of a waveguide axis above the principal surface 13$a$ of the substrate 13. The emitter region 17 includes a first-conductivity-type semiconductor on at least one of the first side surface 15$b$, the second side surface 15$c$, the top surface 15$d$, and the bottom surface 15$e$ of the active region 15. The emitter region 17 includes one or a plurality of semiconductor layers. The collector region 19 includes a quantum filter structure 25 on at least one of the first side surface 15$b$, the second side surface 15$c$, and the third side surface 15$f$ of the active region 15. The collector region 19 includes one or a plurality of semiconductor layers. The collector region 19 is separated from the emitter region 17 on the mesa structure MS. The first side surface 15b and second side surface 15c of the active region 15 extend in the direction of a second axis Ax2. The second axis Ax2 extends in a direction intersecting the first axis Ax1. The first side surface 15b and the second side surface 15c extend in the direction of a third axis Ax3. The third axis Ax3 extends in a direction intersecting the first axis Ax1 and the second axis Ax2. The waveguide axis extends in the direction of the third axis Ax3. The third side surface 15f intersects the waveguide axis and extends in the direction of the second axis Ax2.

In the semiconductor laser 11, the emitter region 17 supplies carriers to the active region 15 from at least one of the top surface 15d, the bottom surface 15e, the first side surface 15b, and the second side surface 15c of the active region 15. The carriers injected from the emitter region 17 generate light through transitions from upper to lower energy levels in the subband structure of the quantum well structures 21. The carriers at the lower energy level flow into the collector region 19. This semiconductor laser 11 utilizes optical transitions of unipolar carriers for light emission. In addition, the arrangement of the emitter region 17, the active region 15, and the collector region 19 does not require cascaded radiative transitions of unipolar carriers for light emission. The quantum filter structure 25 of the collector region 19 extends in the direction of the first axis Ax1 along at least one of the first side surface 15b, the second side surface 15c, and the third side surface 15f of the active region 15. Furthermore, the quantum filter structure 25 is in contact with that side surface of the active region 15 and is connected in parallel to the quantum well structures 21. The parallel connections to the quantum well structures 21 allow cascaded radiative transitions to be avoided. The carriers in the individual quantum well structures 21 drift toward the collector region 19 in the direction of an axis intersecting the direction of the first axis Ax1 (the second axis Ax2 and the third axis Ax3). The quantum filter structure 25 of the collector region 19 selectively transmits the carriers of the lower energy level. As shown in FIG. 2, the quantum filter structure 25 of the collector region 19 has a superlattice structure having filter characteristics that allow carriers of the lower energy level (e.g., E1) of the quantum well structures 21 to have a higher transmission probability than that of carriers of the higher energy level (e.g., E3) of the quantum well structures 21. In addition, the quantum filter structure 25 is configured to provide filter characteristics that allow carriers of the lower energy level (e.g., E1 and E2) of the quantum well structures 21 to have a higher transmission probability than that of carriers of the higher energy level (e.g., E3) of the quantum well structures 21. Furthermore, the quantum filter structure 25 is configured to provide filter characteristics that allow carriers of the lower energy level (e.g., E2) of the quantum well structures 21 to have a higher transmission probability than that of carriers of the higher energy level (e.g., E3) of the quantum well structures 21.

Referring to FIG. 2, the superlattice structure of the quantum filter structure 25 includes a plurality of first semiconductor layers 25a containing aluminum as a group III constituent element and a plurality of second semiconductor layers 25b containing gallium as a group III constituent element. The first semiconductor layers 25a and the second semiconductor layers 25b in the quantum filter structure 25 are alternately arranged. The first semiconductor layer 25a serves as a barrier layer, and is made of III-V compound semiconductor containing three or more elements (e.g., three or four elements) including aluminum as a group III constituent element, for example, AlInAs. The second semiconductor layer 25b serves as a well layer, and is made of III-V compound semiconductor containing three or more elements (e.g., three or four elements) including gallium as a group III constituent element, for example, GaInAs. The superlattice structure of the quantum filter structure 25 includes, for example, an alternating arrangement of three wells and four barriers.

First Example of Superlattice Structure of Quantum Filter Structure 25

AlInAs barrier layers: 2 nm thick, four layers
GaInAs well layers: 4.25 nm thick, three layers
The quantum filter transmission characteristics shown in FIG. 2 allow carriers having an amount of energy equivalent to the relaxation energy level E1 (e.g., 0.14 eV) to easily pass through the quantum filter structure 25 while making it difficult for carriers having an amount of energy equivalent to the upper energy level E3 (e.g., 0.45 eV) to pass through the quantum filter structure 25.

Second Example of Superlattice Structure of Quantum Filter Structure 25

The AlInAs/GaInAs system may include fewer well and barrier layers than those in the first example and/or may include well and barrier layers that differ in thickness from those in the first example. Specifically, the AlInAs/GaInAs system may include a stacked semiconductor layer composed of a total of three well and barrier layers or a stacked semiconductor layer composed of a total of five well and barrier layers.

Third Example of Superlattice Structure of Quantum Filter Structure 25

The barrier layers are made of AlInAs. The well layers contain gallium as a group III constituent element. The well layers preferably include a semiconductor layer having substantially the same band gap energy as that of GaInAs.
AlInAs/GaAsSb (barrier layer/well layer)
The barrier layers are made of AlInAs. The well layers contain gallium and indium as group III constituent elements.
AlInAs/InGaSb (barrier layer/well layer)
AlInAs/AlGaInAs (barrier layer/well layer)
The barrier layers are made of AlInAs. The well layers contain gallium as a group III constituent element and antimony as a group V constituent element.
AlInAs/GaAsSb (barrier layer/well layer)
AlInAs/InGaSb (barrier layer/well layer)
The barrier layers are made of AlInAs. The well layers contain gallium and indium as group III constituent elements and arsenic as a group V constituent element.
AlInAs/GaInAs (barrier layer/well layer)
AlInAs/AlGaInAs (barrier layer/well layer)

Fourth Example of Superlattice Structure of Quantum Filter Structure 25

The well layers are made of GaInAs. The barrier layers contain aluminum and gallium as group III constituent elements. The barrier layers preferably include a semiconductor layer having a larger band gap energy than that of AlInAs.
AlGaPSb/GaInAs (barrier layer/well layer)
AlGaAsSb/GaInAs (barrier layer/well layer)
The well layers are made of GaInAs. The barrier layers contain aluminum and indium as group III constituent elements.
AlInPSb/GaInAs (barrier layer/well layer)
AlInAsSb/GaInAs (barrier layer/well layer)
The well layers are made of GaInAs. The barrier layers contain aluminum as a group III constituent element and antimony as a group V constituent element.

AlGaPSb/GaInAs (barrier layer/well layer)
AlGaAsSb/GaInAs (barrier layer/well layer)
AlInPSb/GaInAs (barrier layer/well layer)
AlInAsSb/GaInAs (barrier layer/well layer)
The well layers are made of GaInAs. The barrier layers contain aluminum as a group III constituent element and antimony and arsenic as group V constituent elements.
AlGaAsSb/GaInAs (barrier layer/well layer)
AlInAsSb/GaInAs (barrier layer/well layer)
The well layers are made of GaInAs. The barrier layers contain aluminum as a group III constituent element and antimony and phosphorus as group V constituent elements.
AlGaPSb/GaInAs (barrier layer/well layer)
AlInPSb/GaInAs (barrier layer/well layer)
The well layers are made of GaInAs. The barrier layers contain aluminum as a group III constituent element and antimony, arsenic, and phosphorus as group V constituent elements.
AlPAsSb/GaInAs (barrier layer/well layer)

Fifth Example of Superlattice Structure of Quantum Filter Structure 25

The superlattice structure includes well layers of any of the materials shown in the first to fourth examples and barrier layers of any of the materials shown in the first to fourth examples. The combinations of materials used in the first to fifth examples are selected so as to have a small lattice mismatch between the well layers and the barrier layers in order to avoid the introduction of crystal defects into the superlattice structure.

FIG. 3 schematically shows the quantum well structures and energy level of the semiconductor laser according to this embodiment. The vertical coordinate axis (vertical axis) indicates the energy level of carriers. The remaining two coordinate axes (horizontal axes) indicate the X- and Z-axes and the Y-axis for space coordinates. In the embodiment, the X-axis, the Y-axis, and the Z-axis correspond to the second axis Ax2, the first axis Ax1, and the third axis Ax3, respectively. Although the description with reference to FIG. 3 is directed toward a configuration in which electrons serve as carriers, this description may also be read in the context of a configuration in which holes serve as carriers based on knowledge about semiconductor physics.

As shown in FIGS. 1 and 3, the active region 15 includes one or a plurality of unit cells 15a. Each unit cell 15a includes, for example, a first well layer 21a, a second well layer 21b, a first barrier layer 21c, and a second barrier layer 21d. The second barrier layer 21d separates the first well layer 21a from the second well layer 21b. The first well layer 21a separates the first barrier layer 21c from the second barrier layer 21d. Each unit cell 15a has a quantum well structure with a well depth (the band-edge energy difference between the barriers layers and the well layers) and a well width (the thickness of the well layers) suited to provide a plurality of energy levels.

By designing the structure of the units cells 15a including the first well layer 21a, the second well layer 21b, the first barrier layer 21c, and the second barrier layer 21d, the unit cells 15a of the quantum well structures 21 may provide an upper energy level E3 and a lower energy level E2 for electrons. In addition to the upper energy level E3 and the lower energy level E2, the unit cells 15a of the quantum well structures 21 may also provide a relaxation energy level E1 for electrons.

In this semiconductor laser 11, as shown in FIG. 2, the quantum well structures 21 provide the upper energy level E3 and the lower energy level E2 for unipolar carriers (e.g., electrons). If the quantum well structures 21 may also provide the relaxation energy level E1. By providing the relaxation energy level E1, the relaxation of unipolar carriers from the lower energy level E2 to the relaxation energy level E1 occurs in a time shorter than the time for transition from the upper energy level E3 to the lower energy level E2.

Carriers (electrons) are injected from the emitter region 17 into the active region 15 in a direction intersecting the stacking direction of the active region 15. The injected electrons undergo a radiative transition from the upper energy level E3 to the lower energy level E2 in the active region 15. This energy difference between the upper energy level E3 and the lower energy level E2 corresponds to the laser oscillation wavelength. The electrons that have transitioned to the lower energy level E2 relax at high speed to the relaxation energy level E1. The electrons having the relaxation energy level E1 in the active region 15 are extracted into the collector regions 19. By providing such energy levels, the quantum well structures 21 facilitate the creation of a population inversion of carriers, thereby increasing the laser gain due to stimulated emission.

The energy level of carriers in the quantum well potential in the unit cells 15a will now be described. The first well layer 21a, the second well layer 21b, the first barrier layer 21c, and the second barrier layer 21d are arranged in the direction of the Y-axis. In the band structure of the unit cells 15a, the energy level in the direction of the Y-axis is quantized into discrete energy levels. On the other hand, the energy level in the direction of the X- and Z-axes is not quantized. The conduction of carriers in the in-plane direction of the X- and Z-axes is understood as a conduction mechanism that can be approximated to a two-dimensional free electron model. The semiconductor laser 11 allows carriers to flow in the in-plane direction perpendicular to the Y-axis. That is, carriers flow in a plane containing the X- and Z-axes. The direction of the Y-axis is the stacking direction of the semiconductor layers forming the quantum well structures 21. Therefore, electrical conduction associated with the quantized levels (E3 and E2) that contribute to light emission is obtained by carriers flowing in the in-plane direction perpendicular to the stacking direction of the semiconductor layers. In contrast, common quantum cascade semiconductor lasers different from the semiconductor laser 11 allow carriers to flow in the direction in which the energy level is quantized, i.e., in the stacking direction of the semiconductor layers forming the quantum well structures 21.

The unit cells 15a are arranged in cascade in the direction of the first axis Ax1 to form the active region 15. The emitter region 17 supplies carriers parallel to the individual unit cells 15a in a direction intersecting the direction of the first axis Ax1. The individual unit cells 15a emit light in parallel as carriers are supplied to the upper energy level (E3) and transition to the lower energy level (E2). The carriers at the lower energy level (E2) relax rapidly and transition to the energy level (E1). The carriers at the energy level (E1) pass through the quantum filter structure 25 selectively.

In each stacked unit cell 15a, the thickness TB1 of the second barrier layer 21d is smaller than the thickness TB2 of the first barrier layer 21c. Thus, the first well layer 21a and the second well layer 21b in each unit cell 15a are separated from the well layers in a neighboring unit cell 15a by the first barrier layer 21c. In addition, the first well layer 21a and the second well layer 21b are coupled with each other more closely than with the well layers in the neighboring unit cell 15a. Quantum energy levels are created in each unit cell 15a.

Example 1

Figure 4:
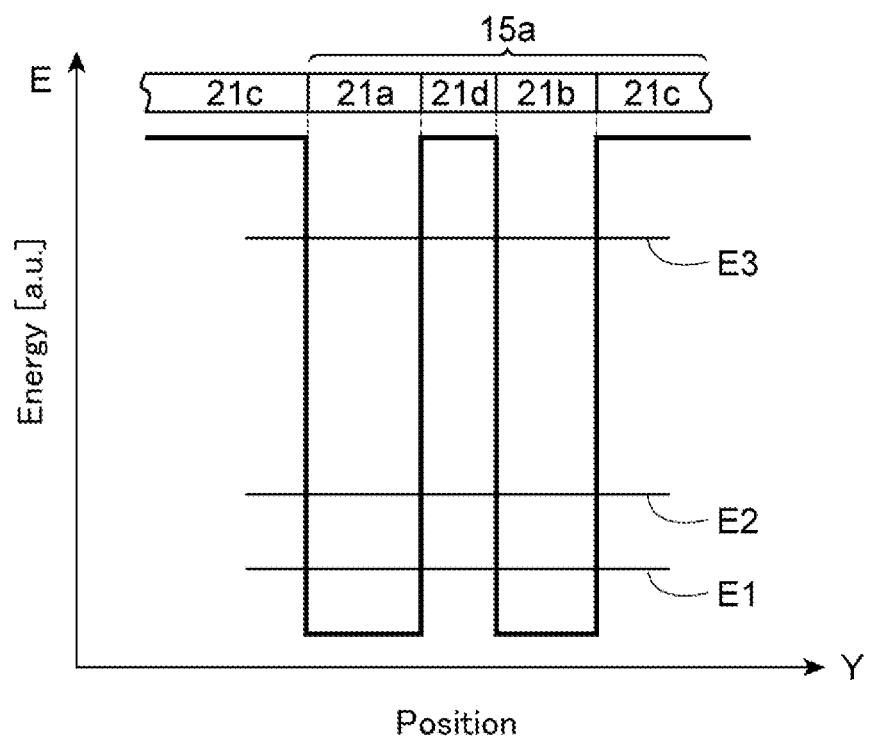
FIG. 4 schematically shows the energy level and layer structure of quantum well structures in Example 1.

The quantum well structures will now be described with reference to FIG. 4. In the following description, electrons function as carriers. Similarly, holes may function as carriers. To increase the probability of transitions from the upper energy level E3 to the lower energy level E2, it is preferred to decrease the carrier density at the lower energy level E2. The decrease of the carrier density at the lower energy level E2 is realized by quickly transiting carriers from the lower energy level E2 to a relaxation energy level E1. Each quantum well structure 21 includes, for example, a plurality of (e.g., two) well layers (21a and 21b) and one or a plurality of barrier layers provided between these well layers. The barrier layer 21d has a thickness smaller than that of the barrier layer 21c. Thus, the wave functions of electrons in the well layers (21a and 21b) extend through the barrier layer 21d into the well layers (21b and 21a) and are coupled to each other. This structure is referred to as "coupled quantum wells". The coupled quantum wells have a symmetrical well structure with respect to the centerline (the center in the thickness direction) of the barrier layer 21d. This structure provides the relaxation energy level E1 that is lower than the lower energy level E2. A difference of energy level between the lower energy level E2 and the relaxation energy level E1 corresponds approximately to the longitudinal optical (LO) phonon energy. Thus, electrons that have undergone radiative transitions from the upper energy level E3 to the lower energy level E2 may transition rapidly to the relaxation energy level E1 through phonon scattering (resonance). The coupled quantum wells also increase the overlap between the wave functions of the upper energy level E3 and the lower energy level E2 and thus increase the probability of radiative transitions, thereby increasing the laser gain.

Specific Example of Coupled Quantum Wells

Well layers/barrier layers: undoped InGaAs/undoped AlInAs

Thickness of well layer (21a): 4 nm

Thickness of inner barrier layer (21d): 2 nm

Thickness of well layer (21b): 4 nm

Thickness of outer barrier layer (21c): 10 nm

Energy difference for oscillation (difference between upper energy level E3 and lower energy level E2): 270 meV (oscillation wavelength: 4.6 μm)

Optical gain: 96 $cm^{-1}$/period

Epop (difference between lower energy level E2 and relaxation energy level E1): 35.6 meV Substrate 13: InP substrate The active region does not require injection layers, which are always included in conventional quantum cascade semiconductor lasers. This results in a greater flexibility in designing the quantum well structures in the quantum cascade semiconductor lasers. In addition, for example, a strain-compensated superlattice structure is used. In the strain-compensated superlattice structure, a tensile stress is introduced into the barrier layers and a compressive stress is introduced into the well layers, for example. By allowing the tensile and compressive stresses to substantially cancel each other out over the entire quantum well structures, a large conduction band gap difference (deep quantum well) can be achieved while good crystallinity is maintained. This results in improved temperature characteristics with reduced carrier leakage and a broader oscillation wavelength range.

Example 2

Figure 5:
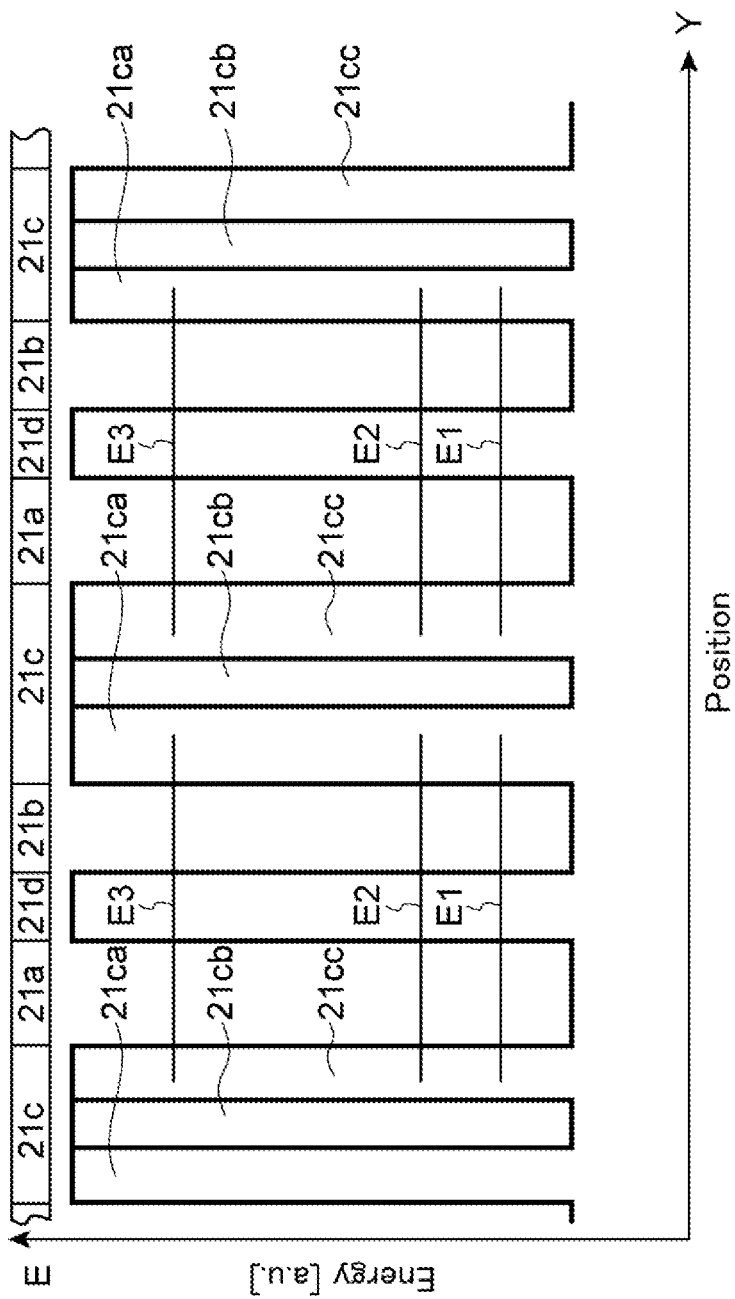
FIG. 5 schematically shows the energy level and layer structure of quantum well structures in Example 2.

As shown in FIG. 5, at least a portion of a barrier layer in each quantum well structure may be doped with a dopant of the same polarity as the carriers. This doping improves the efficiency of injection into both well layers. For example, a 10 nm thick AlInAs barrier layer may include undoped thin region 21ca and 21cc adjacent to the well layers and a doped thin region 21cb therebetween. A doping concentration of about $10^{17}$ $cm^{-3}$ or less is preferred to reduce optical loss due to free carrier absorption. This doped thin region improves the conductivity of the stacked semiconductor layer in the active region in the in-plane direction. As a result, carriers may be supplied to the well layers at positions apart from the emitter region in the in-plane direction.

Figure 6:
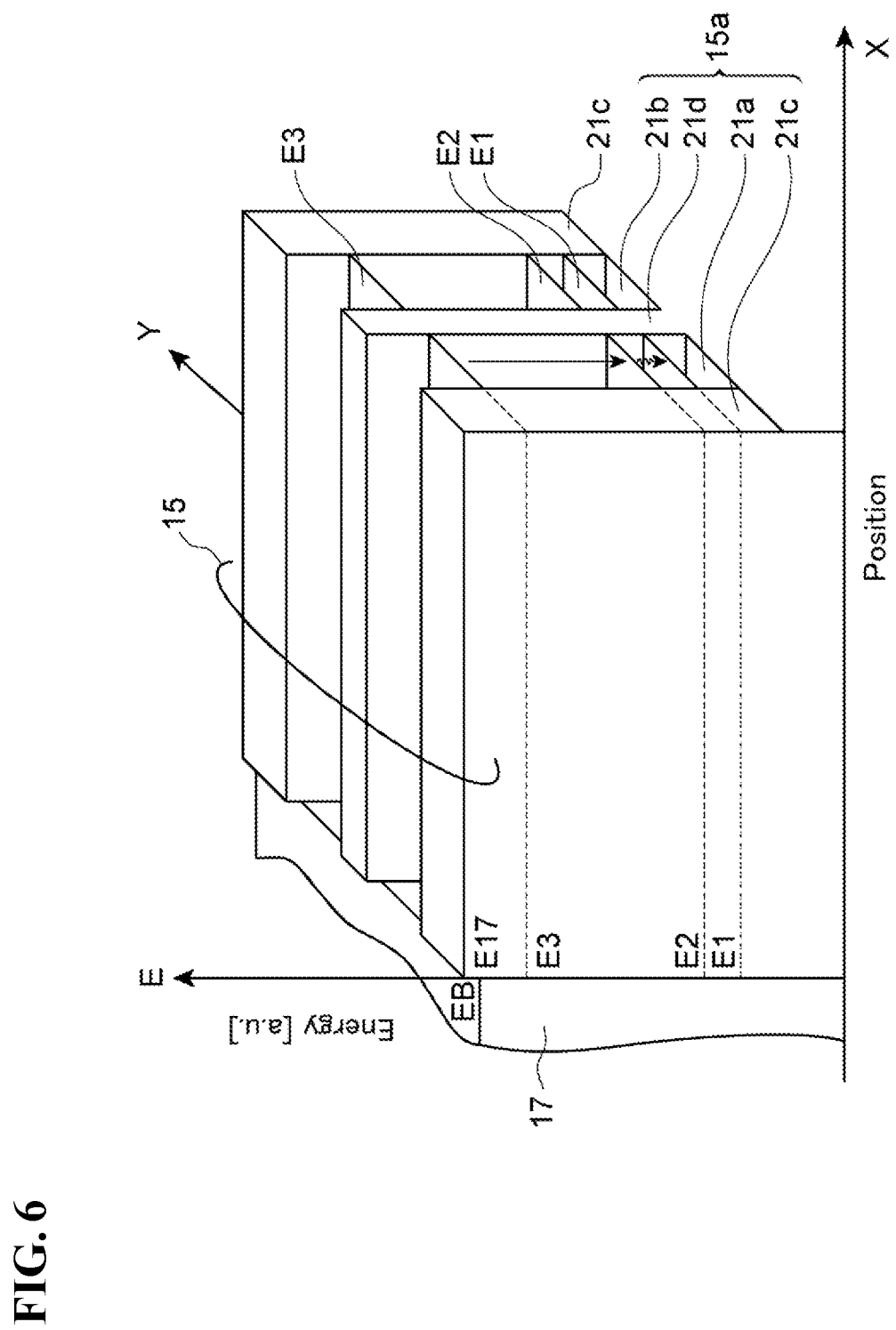
FIG. 6 schematically shows the supply of carriers from an emitter region into a side surface of the active region of the semiconductor laser according to this embodiment.
Figure 9:
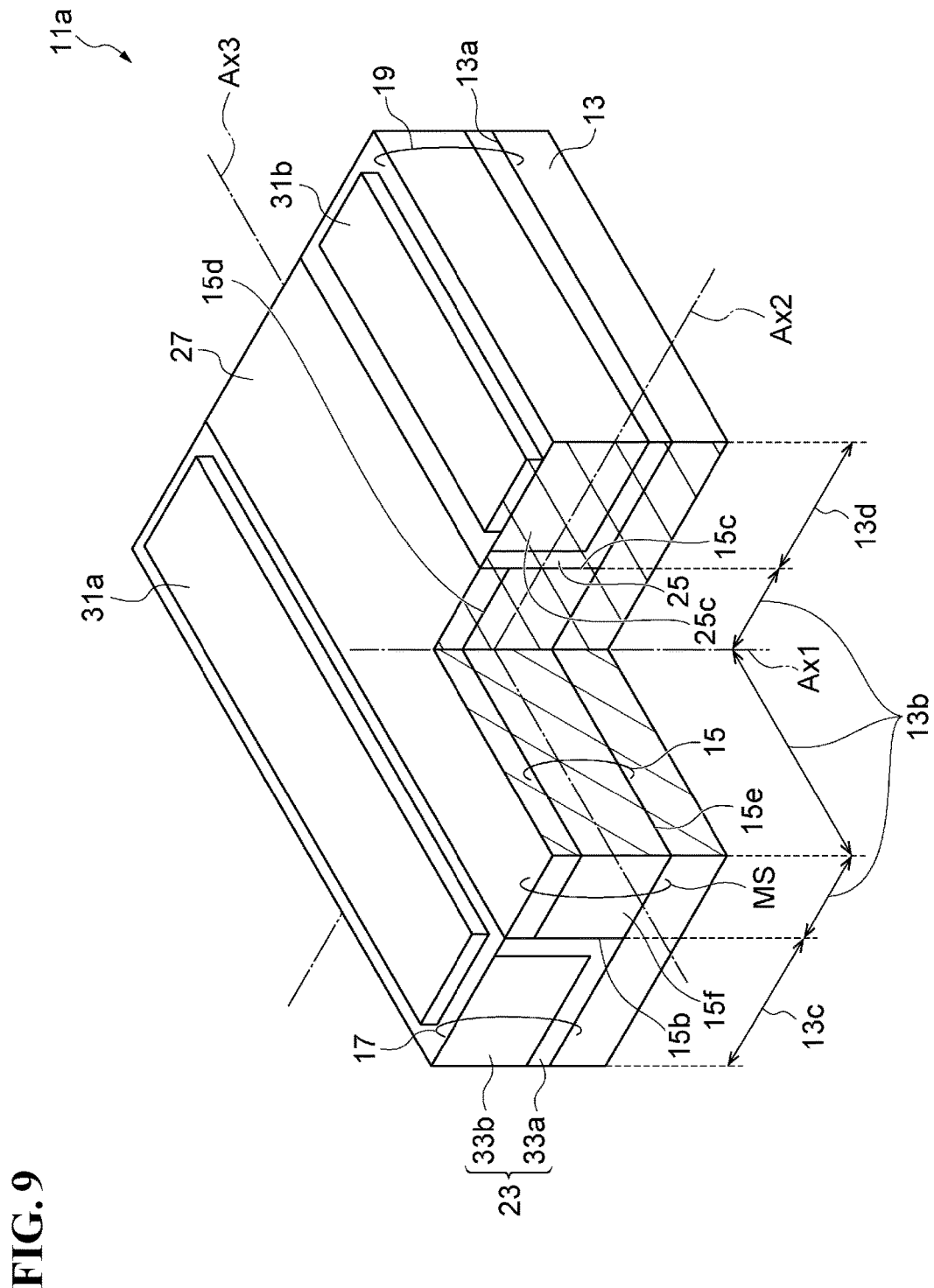
FIG. 9 schematically shows a first structure of the semiconductor laser according to this embodiment.

The supply of carriers from the emitter region into the active region will now be described with reference to FIG. 6. The emitter region includes a semiconductor having a conduction band energy (E17) higher than (higher in the potential direction depending on the carrier polarity) or equal to the upper energy level E3.

The semiconductor laser 11 includes a first electrode 31a disposed on the emitter region 17 and second electrodes 31b disposed on the collector regions 19. The first electrode 31a and the second electrodes 31b are in ohmic contact with the first-conductivity-type semiconductor forming the emitter region 17 and the first-conductivity-type semiconductor forming the collector regions 19, respectively.

The supply of carriers from the emitter region into the active region will now be described with reference to FIGS. 7A, 7B, and 7C. FIG. 7A schematically shows the band structure of the emitter region 17 and the active region 15 under no bias. FIG. 7B schematically shows the band structure of the emitter region 17 and the active region 15 under a forward external bias. In FIGS. 7A and 7B, the arrangement of the unit cells 15a is shown to indicate that the active region 15 has a superlattice structure. Each unit cell 15a is shown in FIG. 7C. In FIGS. 7A and 7B, "$E_{fl}$" indicates the Fermi level or quasi Fermi level, and "$E_{c1}$" indicates the conduction band.

The emitter region 17 may include a first semiconductor layer 33a in contact with the top surface and the side surface of the active region 15 and a second semiconductor layer 33b disposed on the first semiconductor layer 33a. If the first semiconductor layer 33a is provided, the conduction band energy level thereof allows carriers to be injected from the emitter region 17 to the upper energy level E3 of the active region 15 without requiring a large external bias. The second semiconductor layer 33b includes a semiconductor having a refractive index lower than the equivalent refractive index of the active region 15. The conduction band level of the first semiconductor layer 33a is higher than the conduction band level of the second semiconductor layer 33b.

Structure of Emitter Region

First semiconductor layer 33a: undoped AlGaPSb, 20 nm thick

Second semiconductor layer 33b: Si-doped InP, 200 nm thick

If necessary, a semiconductor having a band gap energy between those of InP and AlGaPSb may be disposed between the InP and AlGaPSb layers in the emitter region. For example, the emitter region may have an InP/AlGaInAs/AlGaPSb multilayer structure. These additional semiconductor layers may lower the heterobarrier and thus allow the semiconductor laser to operate at a lower voltage.

As shown in FIG. 7B, an external bias is applied to the semiconductor laser 11 to reduce the heterobarrier between the first semiconductor layer 33a and the second semiconductor layer 33b. As the heterobarrier is reduced, high-energy carriers C (electrons) are injected from the emitter region 17 into the superlattice structure of the active region 15 across the heterobarrier by thermal emission. The injected carriers C are attracted by an electric field and drift or diffuse through the active region 15. Simultaneously, the injected carriers C lose their energy at the levels within the conduction band that correspond to the energies of the individual carriers C, and fall into various unit cells 15a. The carriers C drift through the unit cells 15a toward the collector regions 19 while generating light through optical transitions from the higher energy level (E3) to the lower energy level (E2). The carriers C at the energy level (E2) relax rapidly to the even lower energy level (E1).

The supply of carriers from the emitter region into the active region will now be described with reference to FIGS. 8A, 8B, and 8C. FIG. 8A schematically shows the band structure of the emitter region 22 and the active region 15 under no bias. FIG. 8B schematically shows the band structure of the emitter region 22 and the active region 15 under a forward external bias. In FIGS. 8A and 8B, the arrangement of the unit cells 15a is shown to indicate that the active region 15 has a superlattice structure. The superlattice structure in the unit cells 15a includes well layers and barrier layers that are stacked alternately and periodically. Each unit cell 15a is shown in FIG. 8C. In FIG. 8C, a level E4 in the active region 15 is also shown. In FIGS. 8A and 8B, "$E_{d1}$" indicates the Fermi level or quasi Fermi level, and "$E_{c1}$" indicates the conduction band. The emitter region 22 includes a first semiconductor layer 32a including a tunneling structure 32 adjacent to the top surface of the active region 15.

Structure of Emitter Region 22
First semiconductor layer 32a: undoped AlGaPSb/GaInAs
Second semiconductor layer 32b: Si-doped InP, 200 nm thick
The conduction band level of the first semiconductor layer 32a is higher than the conduction band level of the second semiconductor layer 32b.
The tunneling structure 32 has, for example, the following structure: AlGaPSb (5 nm thick)/GaInAs (2 nm thick)/AlGaPSb (5 nm thick)

As shown in FIG. 8B, an external bias is applied to the semiconductor laser 11 to reduce the heterobarrier between the first semiconductor layer 32a and the second semiconductor layer 32b. As the conduction band level of the second semiconductor layer 32b approaches the discrete energy level (E4) in the active region 15, the carriers C are injected from the conduction band of the second semiconductor layer 32b to the energy level (E4) of the superlattice structure of the active region 15 by tunneling T through the tunneling structure 32. The injected carriers C are attracted by an electric field and drift or diffuse through the active region 15. Simultaneously, the injected carriers C lose their energy at the levels within the conduction band that correspond to the energies of the individual carriers C (e.g., the level E4), and fall into various unit cells 15a. The carriers C drift through the unit cells 15a toward the collector regions 19 while generating light through optical transitions from the higher energy level (E3) to the lower energy level (E2). The carriers C at the energy level (E2) relax rapidly to the even lower energy level (E1).

Referring to FIGS. 9, 10, 11, and 12, several specific structures of the semiconductor laser 11 will be described.
First Structure
Referring to FIG. 9, in a semiconductor laser 11a, the mesa structure MS includes the active region 15 and a first cladding layer 27. The active region 15 and the first cladding layer 27 extend in the direction of the waveguide axis. The first cladding layer 27 is disposed on the top surface 15d of the active region 15. The bottom surface 15e of the active region 15 is in contact with the principal surface 13a of the substrate 13. The principal surface 13a of the substrate 13 includes a first area 13b, a second area 13c, and a third area 13d. The first area 13b, the second area 13c, and the third area 13d extend in the direction of the third axis Ax3 (waveguide axis). The first area 13b is located between the second area 13c and the third area 13d and separates the second area 13c from the third area 13d. The emitter region 17 includes a first semiconductor region 23 of a first conductivity type on the second area 13c. The collector region 19 includes a second semiconductor region 25c of the first conductivity type on the third area 13d. The active region 15 is included in the mesa structure MS, which is disposed on the first area 13b of the principal surface 13a. The active region 15 and the collector region 19 include portions arranged in the direction of the second axis Ax2, which intersects the waveguide axis. The quantum filter structure 25 is applied to the structure in which the active region 15 and the collector region 19 are arranged in the direction of the second axis Ax2. The emitter region 17, the active region 15, and the collector region 19 are arranged in the direction of the second axis Ax2. The emitter region 17, the active region 15, and the collector region 19 extend in the direction of the third axis Ax3. The emitter region 17 and the collector region 19 are electrically separated from each other. Carriers flow from the emitter region 17 through the active region 15 into the collector region 19. In this arrangement, the unit cells 15a of the active region 15 are arranged in the direction of the first axis Ax1. The unit cells 15a arranged in the active region 15 are connected in parallel to the emitter region 17 and are also connected in parallel to the collector region 19. Specifically, the emitter region 17 is in contact with the first side surface 15b of the active region 15 and supplies carriers of the first conductivity type (electrons or holes) to the active region 15. The collector region 19 is in contact with another side surface (e.g., the second side surface 15c) of the active region 15 and receives carriers of the first conductivity type (electrons or holes) from the active region 15 through the quantum filter structure 25. The quantum filter structure 25 of the collector region 19 is in contact with the second side surface 15c of the active region 15. Furthermore, the quantum filter structure 25 has filter characteristics that allow carriers that have transitioned to the lower energy level to have a higher transmission probability than carriers at the higher energy level. The carriers that have transitioned to the lower energy level are more likely to pass through the quantum filter structure 25. A first electrode 31a is disposed on the emitter region 17. The first electrode 31a is in contact with a contact layer 28a on the emitter region 17. A second electrode 31b is disposed on the collector region 19. The third side surface 15f extends in the direction of the second axis Ax2 and intersects the direction of the waveguide axis. Laser light is emitted from the third side surface 15f.

Figure 10:
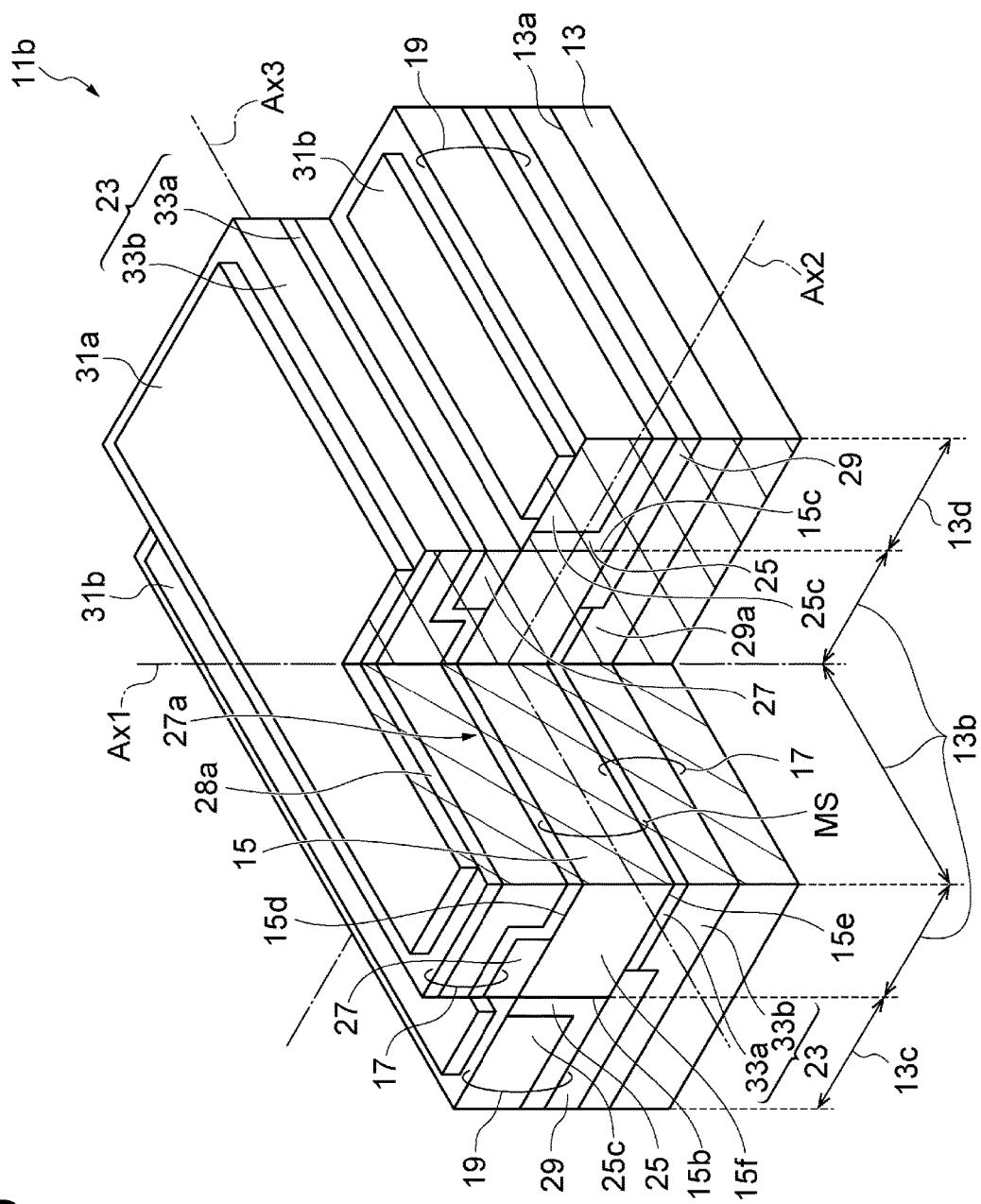
FIG. 10 schematically shows a second structure of the semiconductor laser according to this embodiment.

Second Structure
Referring to FIG. 10, in a semiconductor laser 11b, the principal surface 13a includes a first area 13b, a second area 13c, and a third area 13d. The second area 13c, the first area 13b, and the third area 13d are arranged in the direction of the second axis Ax2, which intersects the first axis Ax1. The active region 15 is included in the mesa structure MS, which is disposed on the first area 13b of the principal surface 13a. The active region 15 and the emitter region 17 extend in the direction of the third axis Ax3 above the principal surface 13a of the substrate 13. The collector region 19 extends along the active region 15 in the direction of the third axis Ax3 above each of the second area 13c and the third area 13d. The active region 15 and the collector regions 19 include portions arranged in the direction of the second axis Ax2, which intersects the waveguide axis. The quantum filter structure 25 is applied to the structure in which the active region 15 and the collector regions 19 are arranged in the direction of the second axis Ax2.

The emitter region 17 includes a first semiconductor region 23. The first semiconductor region 23 is disposed on at least one of the top surface 15d and bottom surface 15e of the active region 15. In this example, the first semiconductor region 23 of the emitter region 17 is disposed on the first area 13b. The quantum filter structure 25 is disposed on at least one of the first side surface 15b and second side surface 15c of the active region 15. In addition to the quantum filter structure 25, each collector region 19 includes a second semiconductor region 25c of a first conductivity type. In this example, the quantum filter structure 25 and the second semiconductor region 25c are disposed on each of the second area 13c and the third area 13d. The active region 15 and the emitter region 17 are arranged on the principal surface 13a of the substrate 13 in the direction of the first axis Ax1. The active region 15 on the first area 13b is disposed between the quantum filter structure 25 of the collector region 19 on the second area 13c and the quantum filter structure 25 of the collector region 19 on the third area 13d. Since the emitter region 17 is disposed on the top surface 15d of the active region 15 above the first area 13b, the collector regions 19 disposed on the second area 13c and the third area 13d may be separated from the emitter region 17. The semiconductor forming the emitter region 17 is of the same conductivity type as that forming the collector regions 19. The semiconductor laser 11b utilizes unipolar carriers. The third side surface 15f extends in the direction of the second axis Ax2 and intersects the direction of the waveguide axis. Laser light is emitted from the third side surface 15f.

The emitter region 17 is disposed on the top surface 15d of the active region 15 above the principal surface 13a of the substrate 13. The collector regions 19 are disposed on the first side surface 15b and second side surface 15c of the active region 15 above the second area 13c and the third area 13d, respectively. The collector regions 19 may include one or a plurality of semiconductor layers. The first area 13b is located between the second area 13c and the third area 13d and separates the second area 13c from the third area 13d. Thus, the emitter region 17 is electrically separated from the two collector regions 19. Thus, carriers flow from the emitter region 17 through the active region 15 into the collector regions 19.

In the semiconductor laser 11b, the first semiconductor region 23 and the second semiconductor region 25c are of the first conductivity type. The active region 15 generates light by utilizing intersubband transitions of unipolar carriers (electrons or holes). The first semiconductor region 23 supplies carriers to the active region 15 through the top surface 15d or bottom surface 15e of the active region 15. The second semiconductor region 25c receives carriers from the first side surface 15b and the second side surface 15c of the active region 15 through the quantum filter structure 25. As carriers are injected from the top surface 15d and/or bottom surface 15e of the active region 15 into the active region 15, the carriers injected from the first semiconductor region 23 spread over the stack of quantum well structures 21 arranged in the direction of the first axis Ax1. Through the optical transitions of carriers in the individual quantum well structures 21, light is generated. The carriers that have undergone transitions flow through the first side surface 15b and the second side face 15c of the active region 15 into the collector regions 19.

As shown in FIG. 10, the active region 15 is disposed in a mesa structure MS extending in the direction of the third axis Ax3. The mesa structure MS includes a first cladding layer 27 disposed on the active region 15 above the first area 13b. The first cladding layer 27 has a resistivity higher than the average resistivity of the active region 15. In this example, the first cladding layer 27 is formed of an insulating or semi-insulating semiconductor. The first cladding layer 27, being formed of a high-resistivity semiconductor, may separate the collector regions 19 from the emitter region 17 on the mesa structure MS. The first cladding layer 27 has an opening 27a reaching the top surface 15d of the active region 15 in the first area 13b. The opening 27a in the first cladding layer 27 extends along the mesa structure MS in the direction of the third axis Ax3. The emitter region 17 is in contact with the top surface 15d of the active region 15 through the opening 27a.

The semiconductor laser 11b includes a second cladding layer 29 disposed on the principal surface 13a of the substrate 13. The mesa structure MS is disposed on the second cladding layer 29 in the first area 13b. The second cladding layer 29 is located between the bottom surface 15e of the active region 15 and the substrate 13. The second cladding layer 29 is formed of a semiconductor having a resistivity higher than the average resistivity of the active region 15. In this example, the second cladding layer 29 is formed of an insulating or semi-insulating semiconductor. The lower emitter region 17 extends through an opening 29a to the bottom surface 15e of the active region 15.

The first cladding layer 27 and the second cladding layer 29 have a refractive index lower than an average refractive index of the active region 15. The emitter region 17 and the collector regions 19 have a refractive index (or average refractive index) lower than the average refractive index of the active region 15. The arrangement of the active region 15, the emitter region 17, the collector regions 19, the first cladding layer 27, and the second cladding layer 29 forms a waveguide structure. The light generated in the active region 15 is optically confined in the transverse direction by the collector regions 19. The light generated in the active region 15 is also optically confined in the perpendicular direction by the emitter region 17, the first cladding layer 27, and the second cladding layer 29. A first electrode 31a is disposed on the emitter region 17. The first electrode 31a is in contact with the contact layer 28a. A second electrode 31b is disposed on the collector region 19.

Third Structure

Figure 11:
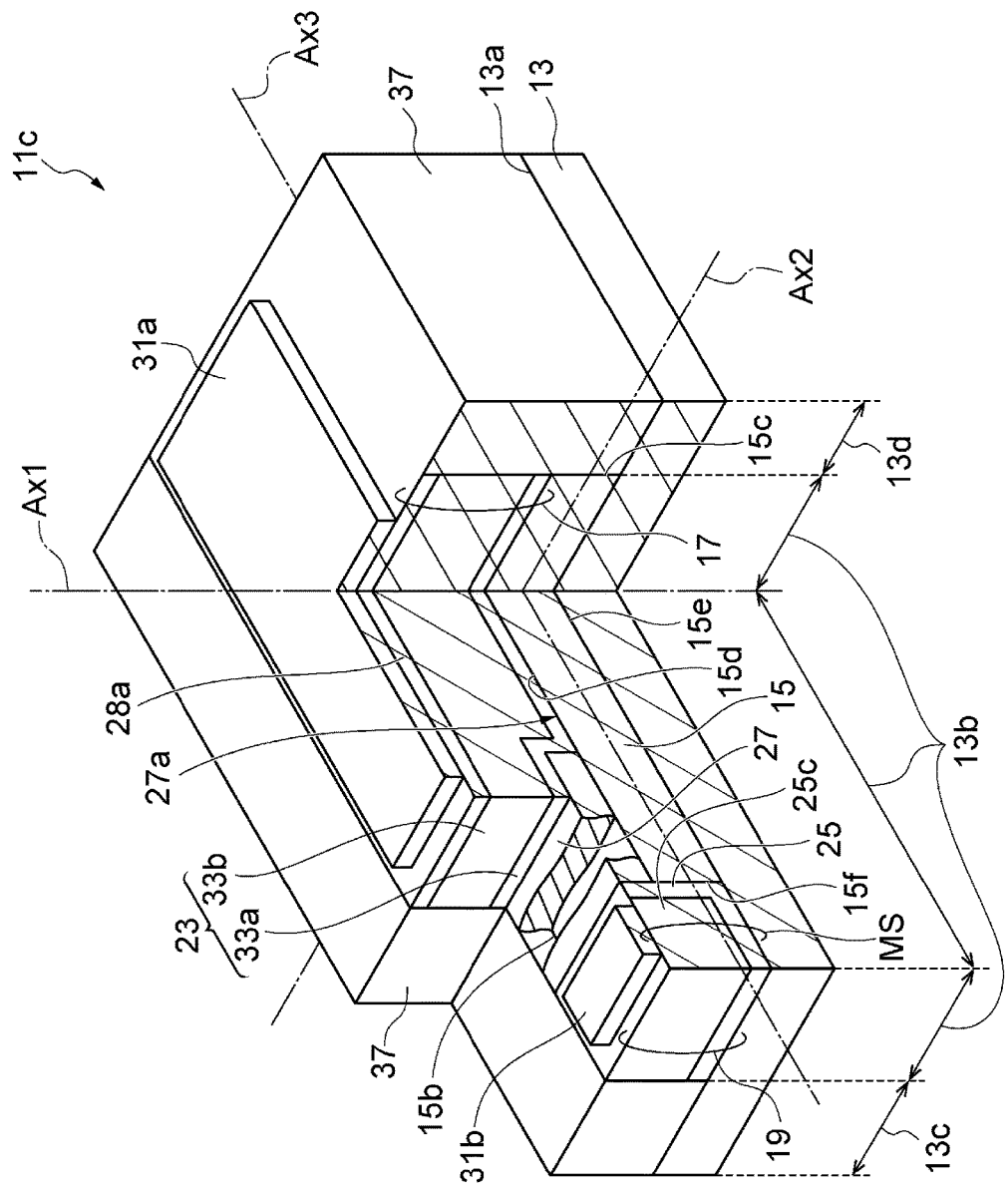
FIG. 11 schematically shows a third structure of the semiconductor laser according to this embodiment.

Referring to FIG. 11, in a semiconductor laser 11c, the substrate 13, the active region 15, and the emitter region 17 are arranged in the first axis Ax1, which intersects the principal surface 13a. The active region 15 and the collector region 19 are arranged in the direction of the waveguide axis (third axis Ax3). The active region 15 and the collector region 19 are disposed above the first area 13b of the principal surface 13a. The active reigion 15 extends in the direction of the third axis Ax3 above the active region 15. The active region 15 and the collector region 19 include portions arranged in the direction of the third axis Ax3 (waveguide axis). The quantum filter structure 25 is applied to the structure in which the active region 15 and the collector region 19 are arranged in the direction of the third axis Ax3. The collector region 19 is separated from the emitter region 17 in the direction of the waveguide axis. The quantum filter structure 25 is applied to the structure in which the collector region 19 is separated from the emitter region 17 in the direction of the third axis Ax3.

The first semiconductor region 23 of the emitter region 17 is disposed on the top surface 15d of the active region 15. In this example, the first semiconductor region 23 of the emitter region 17 is disposed above the first area 13b. The active region 15 and the emitter region 17 are arranged above the principal surface 13a of the substrate 13 in the direction of the first axis Ax1. Specifically, the active region 15 is disposed between the emitter region 17 and the substrate 13. In addition to the quantum filter structure 25, the collector region 19 includes a second semiconductor region 25c of a first conductivity type. In this example, the second semiconductor region 25c, the quantum filter structure 25, and the active region 15 are arranged in sequence in the mesa structure MS in the direction of the waveguide axis. The quantum filter structure 25 is disposed on the third side surface 15f of the active region 15. The quantum filter structure 25 is disposed on at least one of the first side surface 15b and second side surface 15c of the active region 15. The quantum filter structure 25 may also be disposed on the side surface opposite the third side surface 15f.

The collector regions 19 include one or a plurality of semiconductor layers. The semiconductor layers forming the emitter region 17 are of the same conductivity type as those forming the collector regions 19. The semiconductor laser 11 (11a or 11b) utilizes unipolar carriers (electrons or holes). The emitter region 17 is electrically separated from the two collector regions 19, and carriers flow from the emitter region 17 through the active region 15 into the collector regions 19.

The active region 15 and the collector regions 19 are disposed in the mesa structure MS extending in the direction of the third axis Ax3. In addition, the active region 15 and the emitter region 17 are disposed in the mesa structure MS in the first area 13b. The mesa structure MS includes a first cladding layer 27 disposed on the active region 15 above the first area 13b. The first cladding layer 27 has a resistivity higher than the average resistivity of the active region 15. In this example, the first cladding layer 27 is formed of an insulating or semi-insulating semiconductor. The first cladding layer 27, being formed of a high-resistivity semiconductor, may separate the collector regions 19 from the emitter region 17 on the mesa structure MS. The first cladding layer 27 has an opening 27a reaching the top surface 15d of the active region 15 in the first area 13b. The opening 27a in the first cladding layer 27 extends along the mesa structure MS in the direction of the third axis Ax3. The emitter region 17 is in contact with the top surface 15d of the active region 15 through the opening 27a.

The semiconductor laser 11c includes a burying semiconductor region 37 that embeds the mesa structure MS. The burying semiconductor region 37 is formed on side surfaces of the mesa structure MS. Specifically, the burying semiconductor region 37 embeds the active region 15, the first cladding layer 27, the emitter region 17, and the contact layer 28a in the mesa structure MS. The burying semiconductor regions 37 are disposed in the second area 13c and the third area 13d. The burying semiconductor region 37 also embeds the collector region 19 in the mesa structure MS. The burying semiconductor region 37 is formed of, for example, a semi-insulating III-V compound semiconductor doped with a transition metal, such as Fe-doped InP. The burying semiconductor region 37 has a refractive index lower than the average refractive index of the active region 15. Thus, the burying semiconductor region 37 contributes to optical confinement within the active region 15. The emitter region 17 has a first electrode 31a mounted thereon. The first electrode 31a is in contact with the contact layer 28a. The collector region 19 has a second electrode 31b mounted thereon. The lower emitter region 17 extends through an opening 29a to the bottom surface 15e of the active region 15.

Fourth Structure

Figure 12:
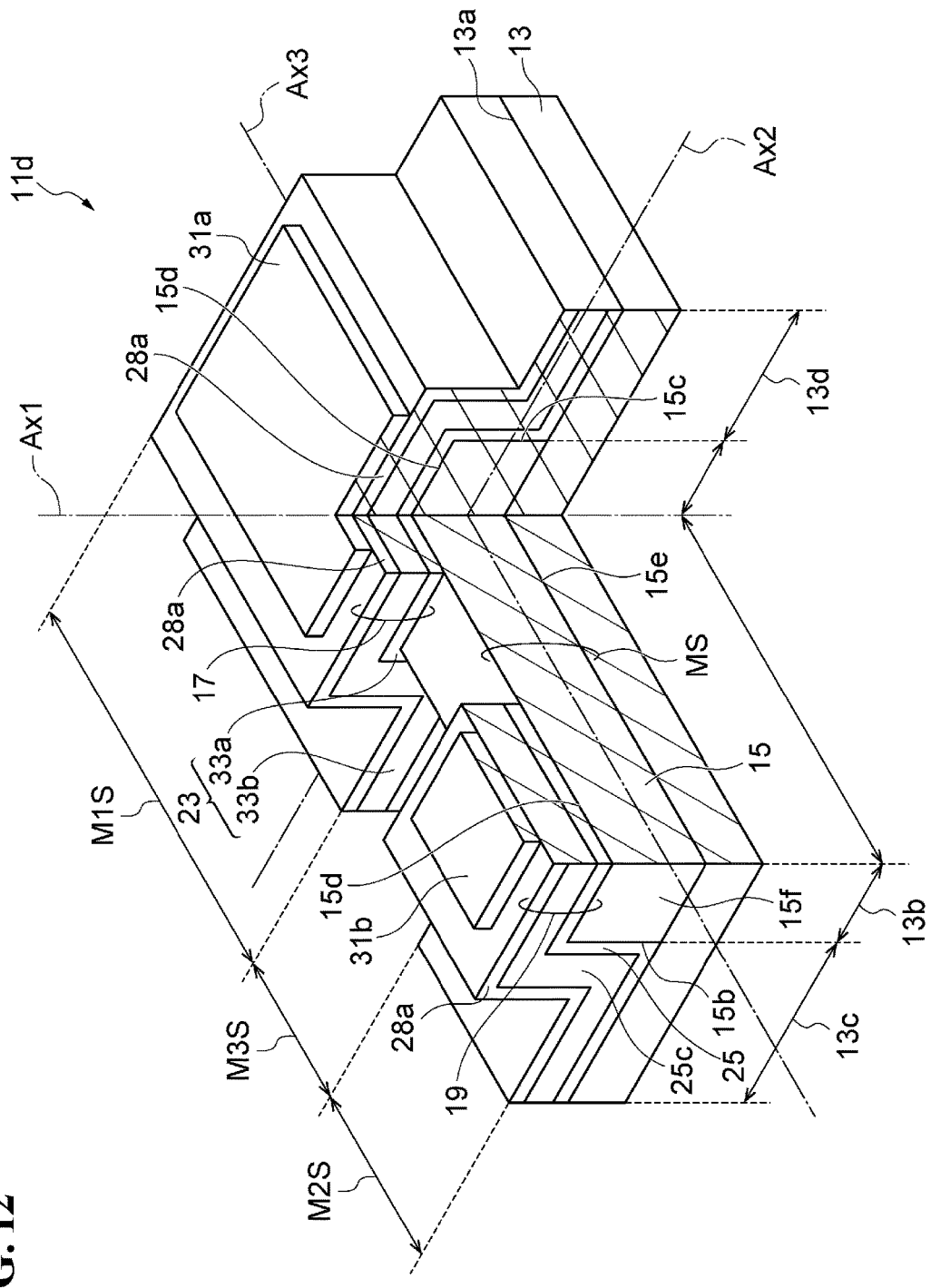
FIG. 12 schematically shows a fourth structure of the semiconductor laser according to this embodiment.

Referring to FIG. 12, in a semiconductor laser 11d, the substrate 13, the active region 15, and the emitter region 17 are arranged in the direction of the first axis Ax1, which intersects the principal surface 13a. The active region 15 has a first side surface 15b, a second side surface 15c, a top surface 15d, a bottom surface 15e, and a third side surface 15f. The third side surface 15f extends in the direction of the second axis Ax2. The first side surface 15b, the second side surface 15c, the top surface 15d, and the bottom surface 15e extend in the direction of the third axis Ax3. The principal surface 13a of the substrate 13 includes a first area 13b, a second area 13c, and a third area 13d. The first area 13b, the second area 13c, and the third area 13d extend in the direction of the third axis Ax3. The first area 13b is located between the second area 13c and the third area 13d. The mesa structure MS is disposed above the first area 13b. The mesa structure MS includes the active region 15. The collector region 19 is separated from the emitter region 17 in the direction of the waveguide axis. The quantum filter structure 25 is applied to the structure in which the collector region 19 is separated from the emitter region 17 in the direction of the third axis Ax3.

The portions of the first semiconductor region 23 of the emitter region 17 that cover the first side surface 15b, the second side surface 15c, and the top surface 15d of the active region 15 extend in the direction of the waveguide axis above the second area 13c, the third area 13d, and the first area 13b, respectively.

The collector region 19 is separated from the emitter region 17 and is disposed on a side surface of the active region 15 in the mesa structure MS. Specifically, the collector region 19 is disposed on at least one of the first side surface 15b, the second side surface 15c, and the third side surface 15f of the active region 15. The collector region 19 also extends along the top surface 15d of the active region 15. In this example, the collector region 19 is disposed on the first side surface 15b and second side surface 15c of the active region 15 above the second area 13c and the third area 13d, respectively. Alternatively, the collector region 19 is disposed on the third side surface 15f above the first area 13b. The quantum filter structure 25 is in contact with the first side surface 15b and the second side surface 15c.

The mesa structure MS has a first portion M1S and a second portion M2S. The first portion M1S and the second portion M2S are arranged in the direction of the waveguide axis (third axis Ax3) above the principal surface 13a of the substrate 13. The active region 15 is included in both the first portion M1S and the second portion M2S. In this example, the first portion M1S of the mesa structure MS is longer than the second portion M2S of the mesa structure MS.

The emitter region 17 is disposed on the active region 15 in the first portion M1S of the mesa structure MS. The collector region 19 is disposed on the active region 15 in the second portion M2S of the mesa structure MS. In addition to the first portion M1S and the second portion M2S, the mesa structure MS includes a third portion M3S. The third portion M3S is disposed between the first portion M1S and the second portion M2S. Neither the emitter region 17 nor the collector region 19 is disposed on the third portion M3S.

The carriers supplied from the first semiconductor region 23 of the emitter region 17 to the active region 15 are of the same conductivity type as those supplied from the active region 15 to the quantum filter structure 25 of the collector region 19. Thus, the semiconductor laser 11d utilizes unipolar carriers. The first portion M1S, on which the emitter region 17 is disposed, is separated from the second portion M2S, on which the collector region 19 is disposed, in the direction of the waveguide axis. Thus, the emitter region 17 is electrically separated from the collector region 19. Carriers flow from the emitter region 17 through the active region 15 into the collector region 19 in the direction of the waveguide axis. A first electrode 31a is disposed on the emitter region 17. The first electrode 31a is in contact with a contact layer 28a. A second electrode 31b is disposed on the collector region 19.

Examples of First, Second, Third, and Fourth Semiconductor Laser Structures
Active region 15: 50-period superlattice structure composed of units of undoped
AlInAs/undoped InGaAs/undoped AlInAs/undoped InGaAs
Emitter region 17: Si-doped InP/undoped AlInAs, Si-doped InP/Si-doped
AlGaInAs/undoped AlInAs, or Si-doped InP/undoped AlGaPSb multilayer structure
Width of emitter region 17 (width of ridge structure): 8 µm
Thickness of emitter region 17: 2 µm
Second semiconductor region 25c of collector region 19: Si-doped InGaAs/Si-doped InP
Width of opening 27a in first cladding layer 27 (upper current-blocking layer): 5 µm
First cladding layer 27 (current-blocking layer): 0.2 µm thick, Fe-doped InP
Width of opening 29a in second cladding layer 29 (lower current-blocking layer): 5 µm
Second cladding layer 29 (current-blocking layer): 1 µm thick, Fe-doped InP
Width of mesa structure MS: 10 µm
Height of mesa structure MS: 1 µm
Thickness of core layer of active region 15: 0.8 µm
Contact layer 28a: 0.1 µm thick, Si-doped GaInAs
First electrode 31a: Ti/Pt/Au
Second electrode 31b: Ti/Pt/Au
Resonator length: 500 µm A method for manufacturing a semiconductor laser having the first structure will now be described in outline with reference to FIGS. 13A and 13B to 15A and 15B. Semiconductor lasers having the second to fourth structures can also be fabricated in the same manner except that the manufacturing conditions, such as the structure of the films to be epitaxially grown, the number of epitaxial growth steps, and the patterns of the etching masks, are changed. In any of these structures, a quantum filter is grown on a side surface of a superlattice structure 65 for forming an active region. This fabrication process will be understood from the following example. In the following description, each cross-section in the method of manufacture shows the progress of the fabrication of the semiconductor laser in a cross-section intersecting the waveguide axis WG.

Figure 13A:
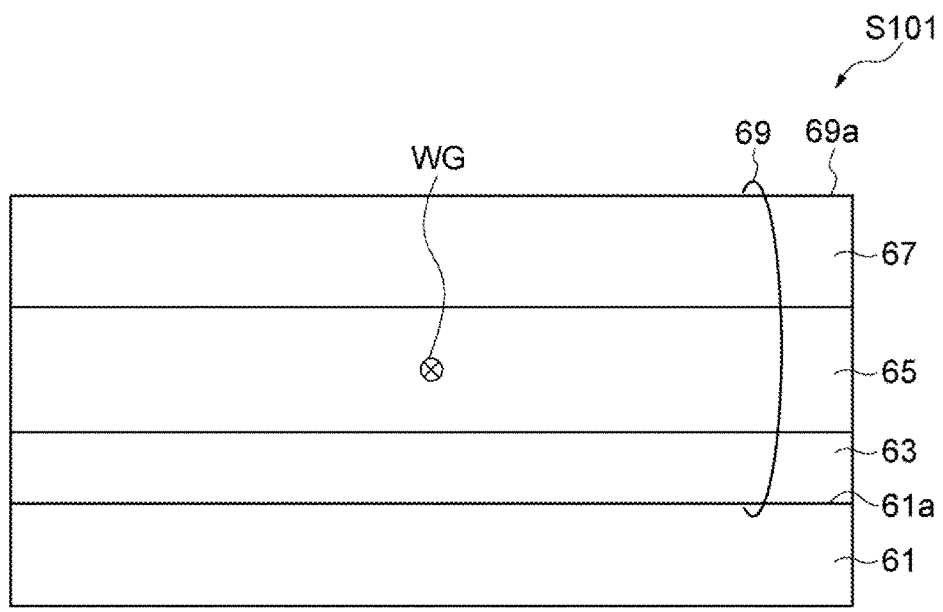
FIGS. 13A and 13B schematically show the main steps of a method for manufacturing the semiconductor laser according to this embodiment.

As shown in FIG. 13A, in step S101, an Fe-doped semi-insulating InP substrate 61 is provided. Crystal growth is performed, for example, by using a molecular beam epitaxy (MBE) method or a metal-organic vapor phase epitaxy (MOVPE) method. An InP layer 63 for forming a lower cladding layer is grown on a principal surface 61a of the InP substrate 61. For example, the InP layer 63 is a Si-doped InP film. A superlattice structure 65 for forming an active region including a stack of unit cells having, for example, the four-layer structure described above is grown on the InP layer 63. An InP layer 67 for forming a current-blocking and upper cladding layer is grown on the superlattice structure 65. The InP layer 67 includes an Fe-doped InP film. By this step, a stacked semiconductor layer 69 is formed.

Figure 13B:
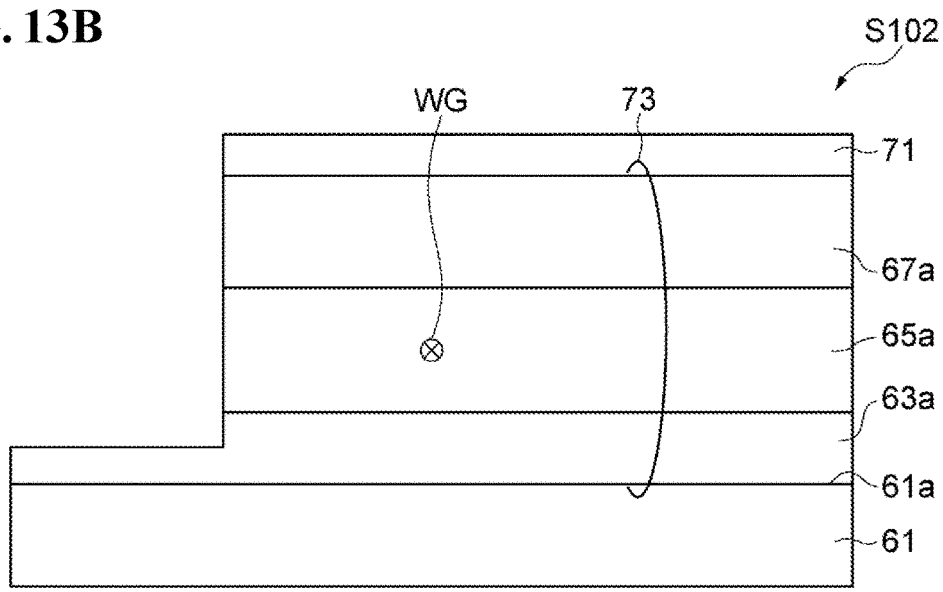

As shown in FIG. 13B, in step S102, a first SiN mask 71 for forming collector regions is formed on a principal surface 69a of the stacked semiconductor layer 69. The first SiN mask 71 includes a stripe-shaped pattern. The stacked semiconductor layer 69 is etched through the first SiN mask 71 to form a stripe structure 73. The stripe structure 73 includes a lower cladding layer 63a, an active region 65a, and an InP layer 67a.

Figure 14A:
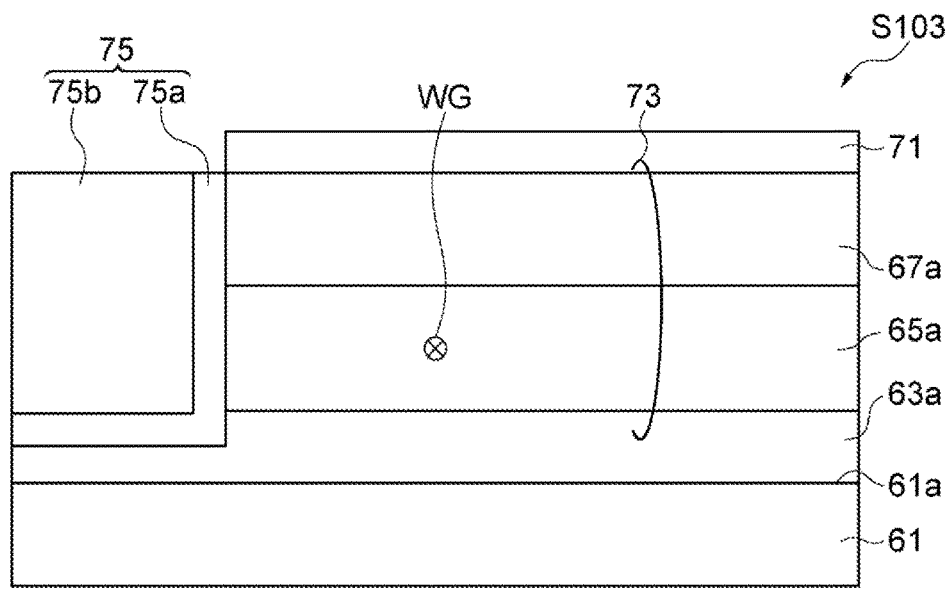
FIGS. 14A and 14B schematically show the main steps of the method for manufacturing the semiconductor laser according to this embodiment.

As shown in FIG. 14A, in step S103, a Si-doped AlInAs layer 75a is selectively grown for forming an emitter region without removing the first SiN mask 71. A Si-doped InP layer 75b is then grown on the Si-doped AlInAs layer 75a to form an emitter region 75. The stripe structure 73 is embedded by the emitter region 75 so as to be planar. The Si-doped AlInAs layer 75a has a thickness of, for example, more than 10 nm.

Figure 14B:
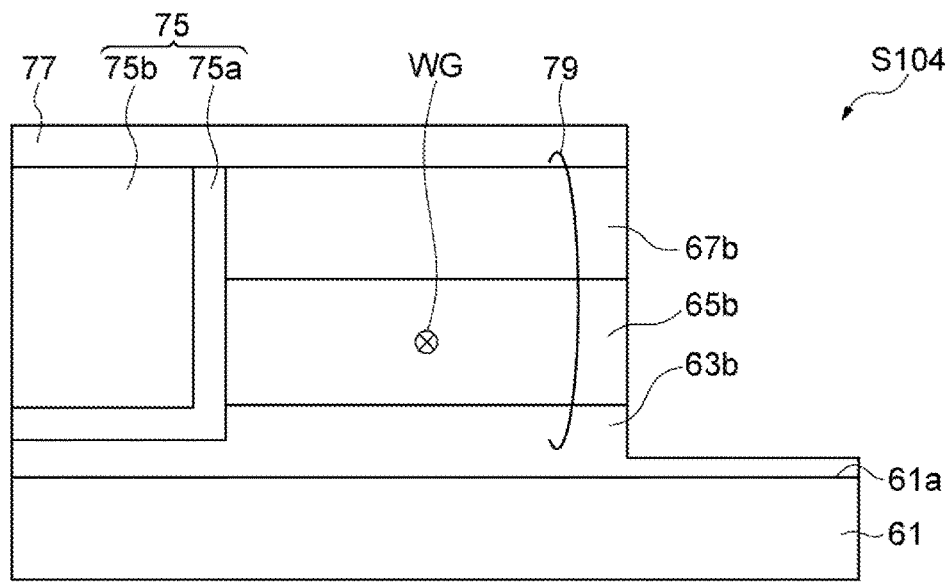

As shown in FIG. 14B, in step S104, after the first SiN mask 71 is removed, a second SiN mask 77 is formed on the stripe structure 73 and the emitter region 75 to form a stripe-shaped mesa structure and a collector region. The stripe structure 73 is etched through the second SiN mask 77 so as to form a mesa structure 79. The mesa structure 79 includes a lower cladding layer 63b, an active region 65b, and an InP layer 67b. A bottom of the mesa structure 79 is included in the lower cladding layer 63b. An Etching condition in the etching process to form the mesa structure 79 is set to form the stripe structure 73 having a side surface substantially perpendicular to the principal surface 61a of the InP substrate 61.

Figure 15A:
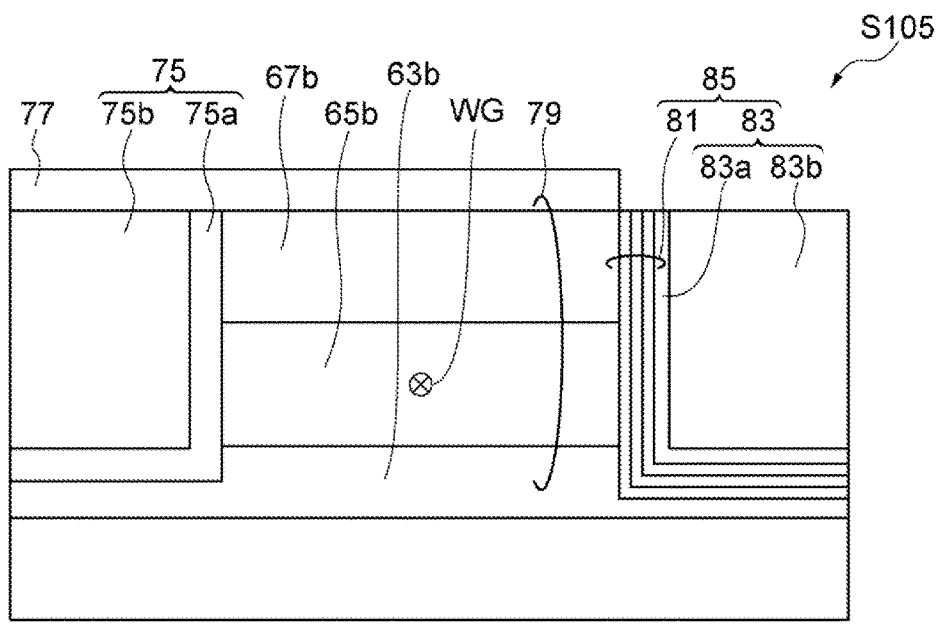
FIGS. 15A and 15B schematically show the main steps of the method for manufacturing the semiconductor laser according to this embodiment.

As shown in FIG. 15A, in step S105, selective growth for forming a collector region including a quantum filter structure is performed without removing the second SiN mask 77. The growth conditions are set so that semiconductor layers grown on the side surface of the mesa structure 79 have a high crystal quality. Specifically, a growth experiment is carried out to obtain the relationship between the composition and growth rate of the individual thin films for forming a quantum filter structure having satisfactory quantum filter characteristics. The growth conditions for lattice match between the semiconductor layers may also be determined by the growth experiment. In this example, to form a quantum filter structure, an AlInAs/GaInAs structure 81 is grown. After the AlInAs/GaInAs structure 81 is grown, a Si-doped GaInAs layer 83a is grown. A Si-doped InP layer 83b is further grown on the Si-doped GaInAs layer 83a to form a collector region 85 (81 and 83) that embeds the mesa structure 79 so as to be planar.

Figure 15B:
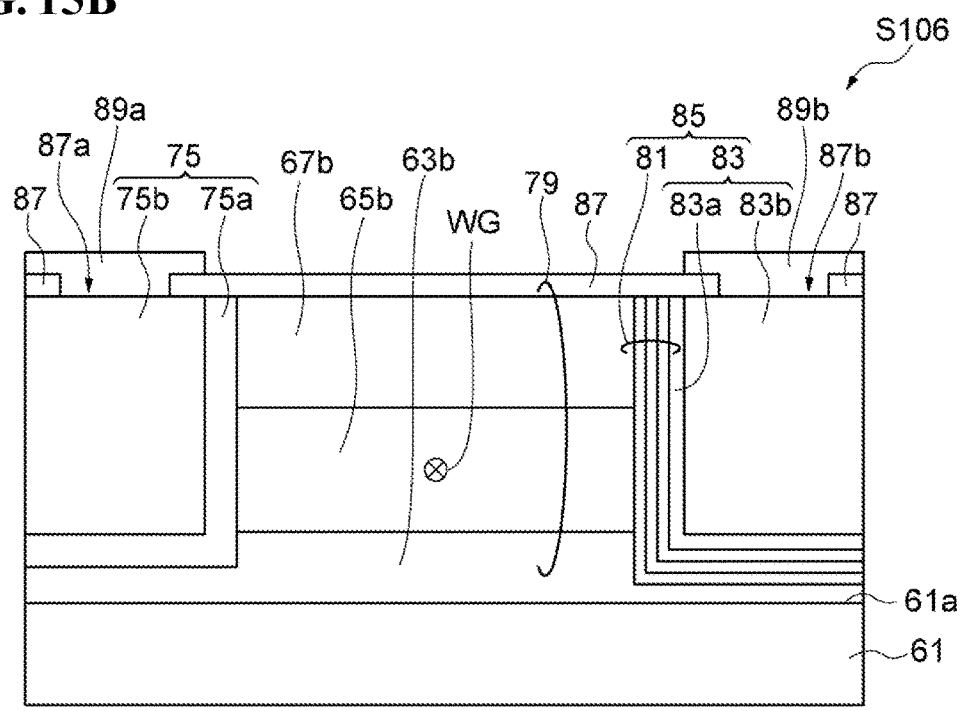

As shown in FIG. 15B, in step S106, after the second SiN mask 77 is removed, a passivation film 87 is formed on the emitter region 75, the mesa stripe 79, and the collector region 85. The passivation film 87 covers the surface of mesa stripe 79. In addition, the passivation film 87 has a first opening 87a and a second opening 87b above the emitter region 75 and the collector region 85, respectively. After the passivation film 87 is formed, a first electrode 89a and a second electrode 89b are formed in the first opening 87a and the second opening 87b, respectively.

As described above, according to this embodiment, a semiconductor laser that can utilize optical transitions of unipolar carriers can be provided.

Although preferred embodiments have been described in order to illustrate the principles of the present invention, those skilled in the art will appreciate that various changes in configuration and details may be made without departing from such principles. The present invention is not limited to any particular configuration disclosed in the foregoing embodiments. Thus, all modifications and changes that come within the scope and spirit of the claims are to be claimed.

What is claimed is:

1. A semiconductor laser comprising:
   a substrate having a principal surface;
   a mesa structure disposed on the principal surface of the substrate, the mesa structure extending in a direction of an axis parallel to the principal surface, the mesa structure including an active region that includes a quantum well structure, the active region having a top surface, a bottom surface, a first side surface, a second side surface, a third side surface, and a fourth side surface;
   an emitter region including a first-conductivity-type semiconductor on at least one of the first side surface, the second side surface, the top surface, and the bottom surface of the active region; and
   a collector region including a quantum filter structure on at least one side surface of the active region, the quantum filter structure having a plurality of layers, each of the layers extending along a plane perpendicular to the principal surface of the substrate, wherein
   the emitter region is in contact with the active region so as to supply carriers to the active region
   the quantum filter structure of the collector region is in contact with the active region so as to selectively receive the carriers from the active region,
   the active region emits light by the carriers,
   the collector region is separated from the emitter region by the active region being therebetween on the mesa structure,
   the first side surface and the second side surface extend in the direction of the axis, and
   the third side surface extends in a direction intersecting the axis.

2. The semiconductor laser according to claim 1, wherein the quantum well structure has an energy band structure with a subband structure that provides a higher energy level and a lower energy level having an energy lower than that of the upper energy level, and
   the quantum filter structure includes a superlattice structure that passes carriers at the lower energy level with a higher transmission probability than that of carriers at the higher energy level.

3. The semiconductor laser according to claim 2,
   wherein the quantum well structure further provides a relaxation energy level having an energy lower than that of the lower energy level.

4. The semiconductor laser according to claim 1, wherein the quantum well structure includes a plurality of unit cells each having a first well layer, a second well layer, a first barrier layer, and a second barrier layer,
   the first barrier layer separates the first well layer from the second well layer, and
   the first well layer separates the first barrier layer from the second barrier layer.

5. The semiconductor laser according to claim 4, wherein the unit cells are arranged in a direction of an axis perpendicular to the principal surface,
   and
   the first barrier layer has a thickness smaller than that of the second barrier layer.

6. The semiconductor laser according to claim 4,
   wherein the first barrier layer is partially or completely doped with a dopant of the first-conductivity-type.

7. The semiconductor laser according to claim 1, wherein the quantum filter structure includes a first III-V compound semiconductor layer containing three or more elements including aluminum as a group III constituent element and a second III-V compound semiconductor layer containing three or more elements including gallium as a group III constituent element,
   the first III-V compound semiconductor layer serves as a barrier layer,
   the second III-V compound semiconductor layer serves as a well layer, and
   the first and second III-V compound semiconductor layers are alternatively arranged on at least one of the side surfaces of the active layer.

8. The semiconductor laser according to claim 1, further comprising a first electrode disposed on the emitter region and a second electrode disposed on the collector region, wherein
   the collector region includes a first-conductivity-type semiconductor,
   the first electrode is electrically connected to the first-conductivity-type semiconductor of the emitter region, and
   the second electrode is electrically connected to the first-conductivity-type semiconductor of the collector region.

* * * * *